(12) United States Patent
Yamazaki et al.

(10) Patent No.: US 9,537,043 B2
(45) Date of Patent: Jan. 3, 2017

(54) PHOTOELECTRIC CONVERSION DEVICE AND MANUFACTURING METHOD THEREOF

(75) Inventors: Shunpei Yamazaki, Setagaya (JP); Hajime Kimura, Atsugi (JP); Yoshiaki Ito, Sagamihara (JP); Takuro Ohmaru, Zama (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 604 days.

(21) Appl. No.: 13/087,714

(22) Filed: Apr. 15, 2011

(65) Prior Publication Data

US 2011/0259420 A1    Oct. 27, 2011

(30) Foreign Application Priority Data

Apr. 23, 2010 (JP) .................................. 2010-100337

(51) Int. Cl.
*H01L 31/0203* (2014.01)
*H01L 31/20* (2006.01)
(Continued)

(52) U.S. Cl.
CPC .............. *H01L 31/202* (2013.01); *C23C 14/08* (2013.01); *C23C 14/34* (2013.01);
(Continued)

(58) Field of Classification Search
CPC ....... H02S 40/32; H01L 31/048; H01L 31/049
(Continued)

(56) References Cited

U.S. PATENT DOCUMENTS 4,525,436 A    6/1985  Yamazaki
5,731,856 A    3/1998  Kim et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature," Appl. Phys. Lett. (Applied Physics Letters) , Sep. 27, 2004, vol. 85, No. 13, pp. 2541-2543.
(Continued)

*Primary Examiner* — Allen Parker
*Assistant Examiner* — Stephen Bradley
(74) *Attorney, Agent, or Firm* — Robinson Intellectual Property Law Office; Eric J. Robinson

(57) ABSTRACT

It is an object to reduce the region of a photoelectric conversion element which light does not reach, to suppress deterioration of power generation efficiency, and to suppress manufacturing cost of a voltage conversion element. The present invention relates to a transmissive photoelectric conversion device which includes a photoelectric conversion element including an n-type semiconductor layer, an intrinsic semiconductor layer, and a p-type semiconductor layer; a voltage conversion element which is overlapped with the photoelectric conversion element and which includes an oxide semiconductor film for a channel formation region; and a conductive element which electrically connects the photoelectric conversion element and the voltage conversion element. The photoelectric conversion element is a solar cell. The voltage conversion element includes a transistor having a channel formation region including an
(Continued)

oxide semiconductor film. The voltage conversion element is a DC-DC converter.

42 Claims, 9 Drawing Sheets

(51) Int. Cl.
    *C23C 14/08* (2006.01)
    *C23C 14/34* (2006.01)
    *H01L 31/0296* (2006.01)
    *H01L 31/0304* (2006.01)
    *H01L 31/0312* (2006.01)
    *H01L 31/0368* (2006.01)
    *H01L 31/0376* (2006.01)
    *H01L 31/0392* (2006.01)
    *H01L 31/075* (2012.01)
    *H01L 31/18* (2006.01)
    *H02S 40/32* (2014.01)
    *H01L 21/02* (2006.01)

(52) U.S. Cl.
    CPC ...... *H01L 31/0296* (2013.01); *H01L 31/0304* (2013.01); *H01L 31/0312* (2013.01); *H01L 31/0392* (2013.01); *H01L 31/03685* (2013.01); *H01L 31/03762* (2013.01); *H01L 31/075* (2013.01); *H01L 31/1816* (2013.01); *H02S 40/32* (2014.12); H01L 21/0262 (2013.01); H01L 21/02422 (2013.01); H01L 21/02538 (2013.01); H01L 21/02554 (2013.01); H01L 21/02565 (2013.01); H01L 21/02672 (2013.01); Y02E 10/544 (2013.01); Y02E 10/545 (2013.01); Y02E 10/548 (2013.01); Y02P 70/521 (2015.11)

(58) Field of Classification Search
    USPC .. 257/53, 431–435; 438/57, 64, 82; 136/259
    See application file for complete search history.

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,478 B2 | 6/2010 | Yanagisawa et al. |
| 8,124,924 B2 | 2/2012 | Yanagisawa et al. |
| 8,754,457 B2 | 6/2014 | Yanagisawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267769 A1 | 11/2006 | Ito et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0074058 A1* | 3/2008 | Lee et al. ............... 315/291 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237669 A1* | 10/2008 | Yanagisawa et al. ........ 257/292 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0026379 A1* | 1/2009 | Yaegashi et al. ........ 250/370.09 |
| 2009/0068773 A1 | 3/2009 | Lai et al. |
| 2009/0073325 A1 | 3/2009 | Kuwabara et al. |
| 2009/0101948 A1* | 4/2009 | Park ................. H01L 27/14609 257/292 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0293954 A1 | 12/2009 | Yamazaki |
| 2010/0059755 A1* | 3/2010 | Anthopoulos et al. ......... 257/59 |
| 2010/0065844 A1 | 3/2010 | Tokunaga |
| 2010/0078071 A1 | 4/2010 | Miyairi et al. |
| 2010/0092800 A1 | 4/2010 | Itagaki et al. |
| 2010/0109002 A1 | 5/2010 | Itagaki et al. |
| 2010/0225615 A1 | 9/2010 | Kurokawa |
| 2010/0294535 A1 | 11/2010 | Koezuka et al. |

(56) References Cited

U.S. PATENT DOCUMENTS

| | | |
|---|---|---|
| 2010/0307557 A1 | 12/2010 | Yamazaki et al. |
| 2010/0307558 A1 | 12/2010 | Yamazaki et al. |
| 2010/0307559 A1 | 12/2010 | Yamazaki et al. |
| 2011/0030783 A1 | 2/2011 | Yamazaki et al. |
| 2011/0068852 A1 | 3/2011 | Yamazaki et al. |
| 2011/0076561 A1 | 3/2011 | Kuriki et al. |
| 2011/0114166 A1* | 5/2011 | Chang ............... H01G 9/2077 136/256 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-356213 | 12/1992 |
| JP | 05-251705 A | 9/1993 |
| JP | 08-264794 A | 10/1996 |
| JP | 09-069647 | 3/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-108466 | 4/2002 |
| JP | 2002-141539 | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-111557 | 4/2004 |
| JP | 2004-181979 | 7/2004 |
| JP | 2004-273614 A | 9/2004 |
| JP | 2004-273732 A | 9/2004 |
| JP | 2005-312158 | 11/2005 |
| JP | 2008-270765 A | 11/2008 |
| JP | 2009-200372 | 9/2009 |
| JP | 2010-010667 | 1/2010 |
| WO | WO-2004/114391 | 12/2004 |
| WO | WO-2008/123119 | 10/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252. The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical papers, Jul. 1, 2009, pp. 227-230, The Japan Society of Applied Physics.

Coates.D et al., "Optical Studies of the Amorphous Liquid-Cholesteric Liquid Crystal Transition: the "Blue Phase",", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium of Technical Papers, May 31, 2009, pp. 983-985.
Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AMOLED Driven by Peald Grown ZnO TFT,", IMID '07 Digest, 2007, pp. 1249-1252.
Godo.H et al., "Temperature Dependence of Characteristics and Electronic Structure For Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics Of Amorphous In-Ga-Zn-Oxide TFT,", SID Digest '09 : SID International Symposium Digest of Technical Papers, May 31, 2009, pp. 1110-1112.
OHara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel, YBFE2O4, and YB2FE3O7 Types of Structures for Compounds in The In2O3 and Sc2O3-A2O3-BO Systems [A;Fe, Ga, or Al; B: Mg, Mn, Fe, Ni, Cu,or Zn] at Temperatures Over 1000°C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review B), Jan. 15, 2000, vol. 61, No. 3, pp. 1811-1816.
Nomura.K et al., "Amorphous Oxide Semiconductors for High-Performance Flexible Thin-Film Transistors,", Jpn. J Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of State,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B. (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

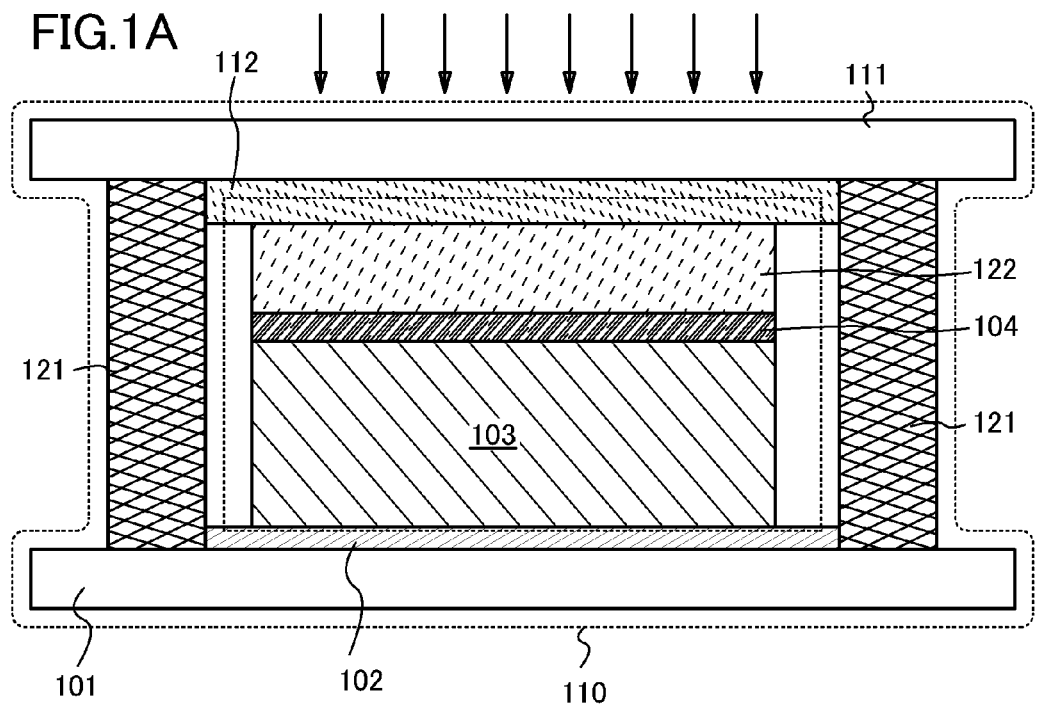
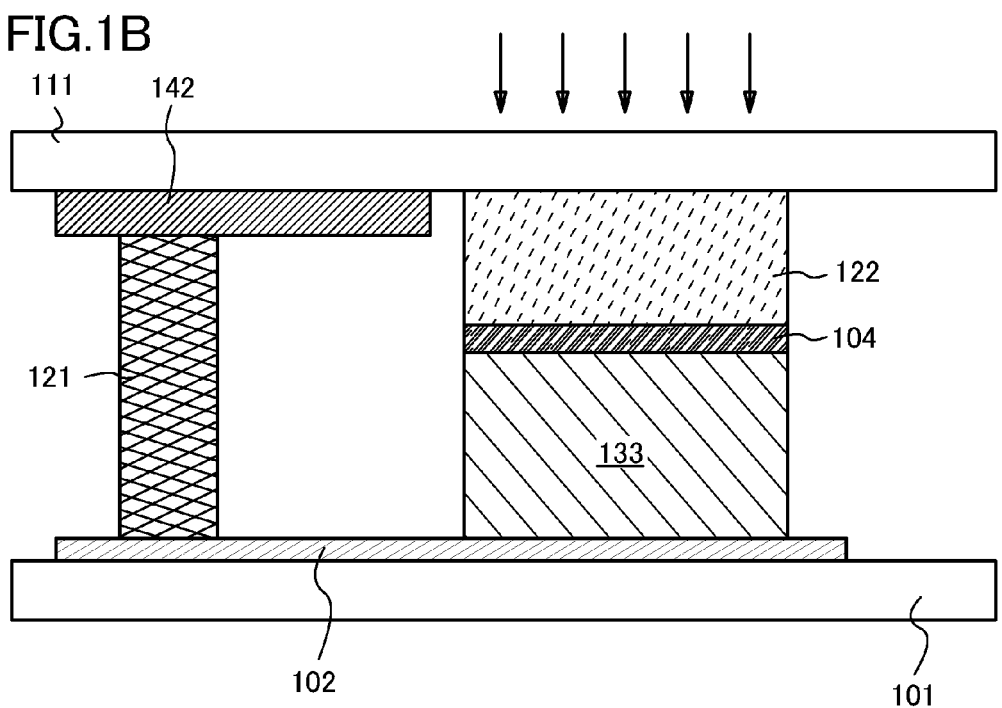

PHOTOELECTRIC CONVERSION DEVICE AND MANUFACTURING METHOD THEREOF

BACKGROUND OF THE INVENTION

1. Field of the Invention

One embodiment of the disclosed invention relates to a photoelectric conversion device and a manufacturing method thereof.

2. Description of the Related Art

As one of photoelectric conversion elements which directly convert received light into power by a photovoltaic effect to output the power, a solar cell can be given (see Patent Document 1). A solar cell needs no energy conversion from received light into thermal energy or kinetic energy in generating power, which is different from a conventional power generation method.

Further, a photoelectric conversion device which has a solar cell and a converter circuit, which converts direct-current (DC) power generated by the solar cell, provided on a non-light receiving surface of the solar cell or the like has attracted attention as a small or middle-sized solar photovoltaic system or an emergency electric supply unit (see Patent Document 2 and Patent Document 3).

As such a converter circuit, a DC-DC converter (direct current—direct current converter), a DC-AC converter (direct current—alternating current converter), or the like can be given, for example (see Patent Document 4 or Patent Document 5)

However, the converter circuit is formed using, for example, a power MOS, IGBT, a Schottky-barrier diode, or the like, so that manufacturing cost is high. Further, it is unfortunately possible that the photoelectric conversion device including the converter circuit cannot be thinner because the converter circuit is thick (see Patent Document 2).

Moreover, the converter circuit needs to be provided with a heat radiation structure to prevent reduction in power conversion efficiency due to a temperature increase (see Patent Document 3). Accordingly, it is difficult to make a photoelectric conversion device including the converter circuit thinner.

REFERENCE

[Patent Document 1] Japanese Published Patent Application No. 2010-010667
[Patent Document 2] Japanese Published Patent Application No. H09-069647
[Patent Document 3] Japanese Published Patent Application No. 2002-141539
[Patent Document 4] Japanese Published Patent Application No. 2005-312158
[Patent Document 5] Japanese Published Patent Application No. 2009-200372

SUMMARY OF THE INVENTION

In view of the above problems, it is an object of an embodiment of the disclosed invention to reduce the thickness of a photoelectric conversion device including both a photoelectric conversion element and a converter circuit.

Further, it is an object of an embodiment of the disclosed invention to suppress reduction in conversion efficiency of the converter circuit due to a temperature increase.

Furthermore, it is an object of an embodiment of the disclosed invention to suppress the manufacturing cost of the converter circuit.

According to an embodiment of the disclosed invention, a converter circuit including a transmissive oxide semiconductor film is formed over a surface of a transmissive substrate which is part of a protective member of a photoelectric conversion element.

Furthermore, according to an embodiment of the disclosed invention, the converter circuit is formed with the use of a thin film circuit using a thin film oxide semiconductor film. Therefore, a photoelectric conversion device including the converter circuit can be thinner.

Moreover, according to an embodiment of the disclosed invention, the converter circuit is formed with the use of a thin film circuit using a thin film oxide semiconductor film as described above; therefore, the cost for manufacturing the converter circuit can be suppressed.

Further, according to an embodiment of the disclosed invention, characteristics of the oxide semiconductor film are stable even when operation temperature is increased. Therefore, the converter circuit including the oxide semiconductor film, and a photoelectric conversion device including the converter circuit are stably operated.

An embodiment of the disclosed invention is a photoelectric conversion device which includes a photoelectric conversion element provided so that external light is delivered from at least one side of the photoelectric conversion element, a protective member configured to encapsulate the photoelectric conversion element, and a converter circuit which is configured to step up or down an output of the photoelectric conversion element and which is provided over one side of the protective member. The converter circuit includes a transistor having a channel formation region including an oxide semiconductor.

An embodiment of the disclosed invention is a photoelectric conversion device which includes a photoelectric conversion element provided so that external light is delivered from at least one side of the photoelectric conversion element, a protective member configured to encapsulate the photoelectric conversion element, and a DC-DC converter which is configured to step up or down an output of the photoelectric conversion element and which is provided over one side of the protective member. The DC-DC converter includes a transistor having a channel formation region including an oxide semiconductor.

An embodiment of the disclosed invention is a photoelectric conversion device which includes a solar cell provided so that external light is delivered from at least one side of the solar cell, a protective member configured to encapsulate the solar cell, and a converter circuit which is configured to step up or down an output of the solar cell and which is provided over one side of the protective member. The converter circuit includes a transistor having a channel formation region including an oxide semiconductor.

An embodiment of the disclosed invention is a photoelectric conversion device which includes a solar cell provided so that external light is delivered from at least one side of the solar cell, a protective member configured to encapsulate the solar cell, and a DC-DC converter which is configured to step up or down an output of the solar cell and which is provided over one side of the protective member. The DC-DC converter includes a transistor having a channel formation region including an oxide semiconductor.

In an embodiment of the disclosed invention, the converter circuit is formed inside the protective member.

In an embodiment of the disclosed invention, the converter circuit is provided in a space surrounded by the protective member.

In an embodiment of the disclosed invention, a member which is included in the protective member and which is provided on the side of the photoelectric conversion element to which external light is delivered is transmissive and the converter circuit is formed on the surface of the transmissive member.

In an embodiment of the disclosed invention, a member which is included in the protective member and which is provided on the side of the photoelectric conversion element to which external light is delivered is transmissive and the DC-DC converter is formed on the surface of the transmissive member.

In an embodiment of the disclosed invention, the converter circuit includes a coil, a diode, and a capacitor.

In an embodiment of the disclosed invention, the DC-DC converter includes a coil, a diode, and a capacitor.

In an embodiment of the disclosed invention, the transistor is a top-gate transistor, and a top surface of the oxide semiconductor film is in contact with a source electrode and a drain electrode of the transistor.

In an embodiment of the disclosed invention, the transistor is a top-gate transistor, and a bottom surface of the oxide semiconductor film is in contact with a source electrode and a drain electrode of the transistor.

In an embodiment of the disclosed invention, the transistor is a bottom-gate transistor, and a top surface of the oxide semiconductor film is in contact with a source electrode and a drain electrode of the transistor.

In an embodiment of the disclosed invention, the transistor is a bottom-gate transistor, and a bottom surface of the oxide semiconductor film is in contact with a source electrode and a drain electrode of the transistor.

According to an embodiment of the disclosed invention, a converter circuit is formed with the use of a thin film circuit including an oxide semiconductor film over a transmissive substrate, so that a photoelectric conversion device can be thinner.

Further, according to an embodiment of the disclosed invention, a converter circuit is formed with the use of a thin film circuit including an oxide semiconductor film, so that cost for manufacturing the converter circuit and a photoelectric conversion device including the converter circuit can be suppressed.

Further, according to an embodiment of the disclosed invention, a power device such as a converter circuit is formed using an oxide semiconductor film with wide band gap, so that temperature characteristics become stable. Therefore, the temperature characteristics of a photoelectric conversion device including the converter circuit can be stable.

BRIEF DESCRIPTION OF THE DRAWINGS

FIGS. 1A and 1B are cross-sectional views of photoelectric conversion devices.

DETAILED DESCRIPTION OF THE INVENTION

Figure 2A:
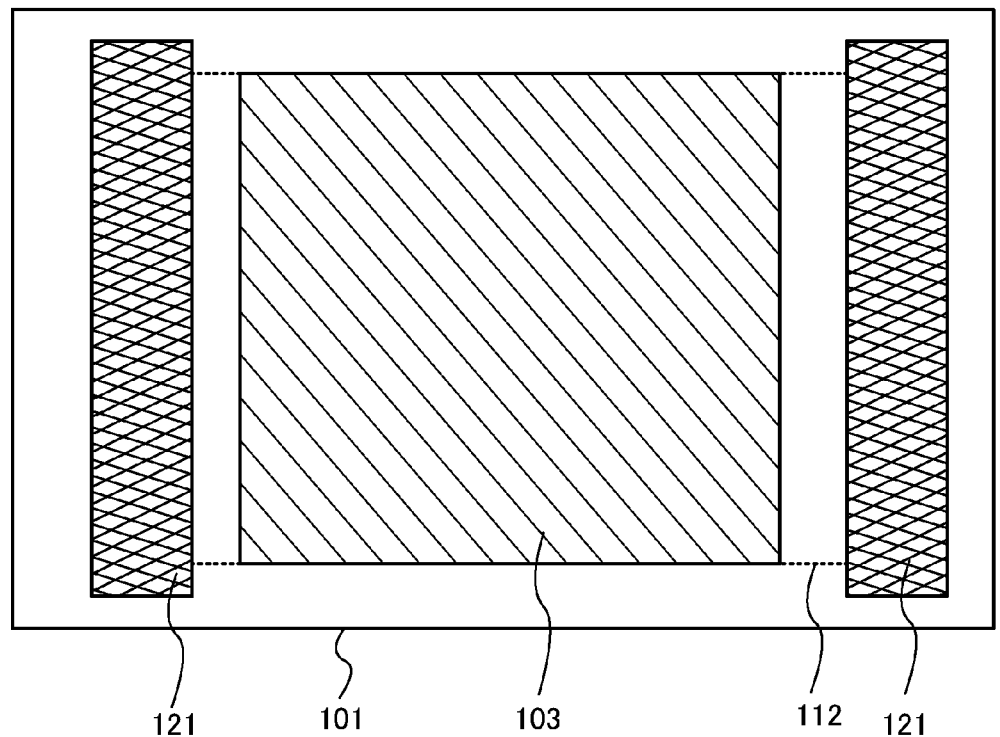
FIGS. 2A and 2B are top views of the photoelectric conversion devices.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of embodiments. Note that, in the drawings hereinafter shown, the same portions or portions having similar functions are denoted by the same reference numerals, and repeated description thereof will be omitted.

[Embodiment 1]

In this embodiment, photoelectric conversion devices each including a photoelectric conversion element and a converter circuit will be described with reference to FIGS. 1A and 1B, FIGS. 2A and 2B, FIGS. 3A to 3C, FIGS. 4A and 4B, FIGS. 5A and 5B, FIGS. 6A to 6E, and FIGS. 7A to 7C.

Figure 2B:
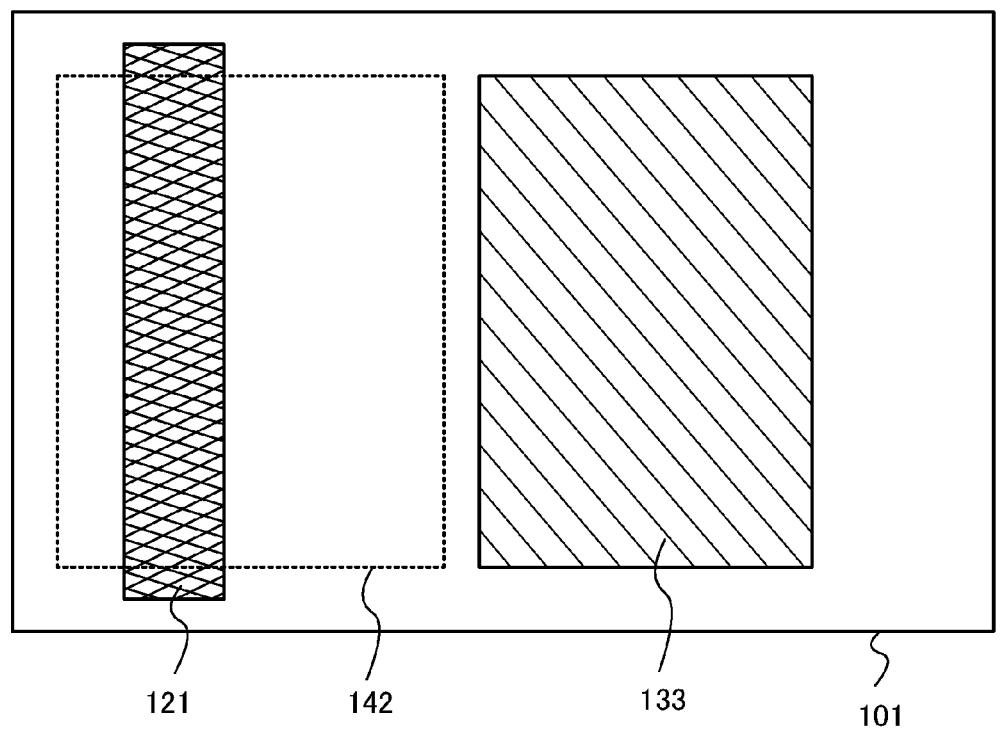

FIG. 1A and FIG. 2A illustrate the photoelectric conversion device of this embodiment. For comparison, FIG. 1B and FIG. 2B illustrate a conventional photoelectric conversion device.

FIG. 1A illustrates a cross-sectional view of the photoelectric conversion device described in this embodiment.

The photoelectric conversion device illustrated in FIG. 1A includes, over a transmissive substrate 101, a transmissive conductive film 102, a photoelectric conversion element 103 provided in contact with the transmissive conductive film, a transmissive conductive film 104 provided in contact with the photoelectric conversion element 103. Further, the photoelectric conversion device illustrated in FIG. 1A includes a converter circuit 112 formed using transmissive materials adjacent to a transmissive substrate 111.

The photoelectric conversion element 103 provided over the substrate 101 and the converter circuit 112 provided adjacent to the transmissive substrate 111 are electrically connected through wirings 121. Thus, DC voltage output from the photoelectric conversion element 103 can be converted by the converter circuit 112. For the wirings 121, a conductive paste or an anisotropic conductive material can be used.

The transmissive substrate 101, the transmissive substrate 111, and the wirings 121 serve as a protective member 110 which encapsulates the photoelectric conversion element 103 and prevents external shock and entrance of impurities.

In other words, the protective member 110 includes the substrate 101 which is a transmissive member, the substrate 111 which is a transmissive member, and the wirings 121 connecting the photoelectric conversion element 103 and the converter circuit 112. Further, the photoelectric conversion element 103 is provided in a space surrounded by the protective member 110; that is, the protective member 110 encapsulates and protects the photoelectric conversion element 103.

Further, the converter circuit 112 is provided in a space surrounded by the protective member 110. It can be said that the converter circuit 112, which is formed adjacent to a surface of the transmissive substrate 111, is formed in contact with a surface of the protective member 110.

The converter circuit 112 is not affected by external shock and entrance of impurities because the converter circuit 112 is formed in a space surrounded by the protective member and in contact with a surface of the protective member.

The converter circuit 112 of this embodiment is formed using transmissive materials. Therefore, light reaches the photoelectric conversion element 103 even when external light is delivered from the substrate 111 side, which is a member of the protective member 110 and over which the converter circuit 112 is formed.

The power generation efficiency of the photoelectric conversion element 103 is improved because external light delivered from the substrate 111 side can be used efficiently.

Further, in the photoelectric conversion device described in this embodiment, light may be delivered from both of the substrate 101 side and the substrate 111 side. Because external light is delivered from both of the substrate 101 side and the substrate 111 side, the amount of external light delivered to the photoelectric conversion device can be increased.

Further, an adhesive layer 122 is provided between the converter circuit 112 and the conductive film 104 provided in contact with the photoelectric conversion element 103. The adhesive layer 122 may be formed using insulative resin or the like. The adhesive layer 122 is provided between the conductive film 104 and the converter circuit 112, so that a distance between the conductive film 104 and the converter circuit 112 can be fixed. Further, the adhesive layer 122 is insulative, so that the conductive film 104 and the converter circuit 112 can be isolated.

FIG. 2A is a top view of the photoelectric conversion device illustrated in FIG. 1A. Because the converter circuit 112 is formed using transmissive materials, the photoelectric conversion element 103 and the converter circuit 112 can be formed to be overlapped with each other as illustrated in FIG. 2A.

Here, "overlap" means that in a plan view, there is a region in which they are overlapped with each other. The same applies to other descriptions of this specification. In this specification, "overlap" also means that in a cross-sectional view, there is a region in which they are overlapped with each other with another substance provided therebetween.

FIG. 1B and FIG. 2B illustrate the photoelectric conversion device in which the converter circuit is formed using a non-transmissive material. FIG. 1B is a cross-sectional view of the photoelectric conversion device, and FIG. 2B is a top view of the photoelectric conversion device. Note that in FIG. 1B and FIG. 2B, the same members as those in FIG. 1A and FIG. 2A are denoted by the same reference numerals.

In the case where the converter circuit is formed using a non-transmissive material and light is delivered from the substrate side on which the converter circuit is provided, the light does not reach a photoelectric conversion layer because the converter circuit blocks the light.

Accordingly, a converter circuit 142 and a photoelectric conversion layer 133 are necessarily formed not to be overlapped with each other as illustrated in FIG. 1B. The area occupied by the photoelectric conversion layer 133 is reduced when the converter circuit 142 and the photoelectric conversion layer 133 are formed not to be overlapped with each other (see FIG. 2B). Reduction in area occupied by the photoelectric conversion layer 133 means reduction in area for receiving light. Therefore, the power generated by the photoelectric conversion layer 133 is reduced.

Figure 3A:
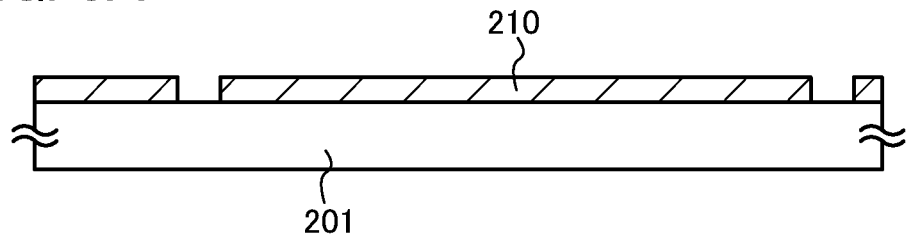
FIGS. 3A to 3C are cross-sectional views showing a manufacturing process of a photoelectric conversion element.

A manufacturing method of a photoelectric conversion element of this embodiment is described with reference to FIGS. 3A to 3C. As an example of a photoelectric conversion element, a solar cell is described in this embodiment.

First, a substrate 201 is prepared. The substrate 201 corresponds to the substrate 101. A material transmissive with respect to sunlight is used for the substrate 201, assuming that light is delivered to a photoelectric conversion layer 211 from the substrate 201 side.

For example, the transmissive substrate 201 can be formed using a glass plate of soda-lime glass, clear glass, lead glass, tempered glass, ceramic glass, or the like. Further, a non-alkali glass substrate of aluminosilicate glass, barium borosilicate glass, aluminoborosilicate glass, or the like; a quartz substrate; or a ceramic substrate can be used.

As the transmissive substrate 201, a substrate made of a synthetic resin having flexibility such as plastics (plastic substrate), which generally has the heat-resistance temperature lower than those of the above-described substrates, can be used as long as it can withstand the process temperature in a manufacturing process.

As a plastic substrate, polyester; polyethersulfone (PES); polyethylene naphthalate (PEN); polycarbonate (PC); a polyamide synthetic fiber; polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; and the like can be given. Polyethylene terephthalate (PET) can be given as polyester, for example.

First, a conductive film 210 processed to have a predetermined shape is formed over the substrate 201. The conductive film 210 may be formed to have a predetermined shape in such a manner that a conductive film is formed over an entire surface of the substrate 201 and then processed by etching, laser irradiation, or the like. Alternatively, a conductive film may be formed to originally have a predetermined shape. The way to form a conductive film originally having a predetermined shape will be described later.

The conductive film 210 is formed using a conductive material which is transmissive with respect to sunlight because light is delivered from the substrate 201 side.

As a transmissive conductive material, for example, indium tin oxide (ITO), indium tin oxide (ITSO) including silicon oxide, organoindium, organotin, zinc oxide (ZnO), indium zinc oxide including zinc oxide (indium zinc oxide (IZO)), ZnO doped with gallium (Ga), tin oxide ($SnO_2$), indium oxide including tungsten oxide, indium zinc oxide including tungsten oxide, indium oxide including titanium oxide, or indium tin oxide including titanium oxide is preferably used.

The conductive film 210 is formed so as to have a thickness of greater than or equal to 40 nm and less than or equal to 800 nm, preferably greater than or equal to 400 nm and less than or equal to 700 nm. In addition, the sheet resistance of the conductive film 210 may be greater than or equal to 20 Ω/square to less than or equal to 200 Ω/square.

In this embodiment, a substrate manufactured by Asahi Glass Co., Ltd. (product name: Asahi-U) in which a 150-nm-thick silicon oxide film and an approximately-600-nm-thick conductive film whose surface has unevenness with the use of tin oxide ($SnO_2$) are sequentially stacked over the substrate 201 of soda-lime glass having a thickness of 1.1 mm is used.

Further, the conductive film including tin oxide is processed to form the conductive film 210 electrically connecting cells 202 formed later (see FIG. 3A).

Note that as described above, the conductive film 210 can be formed in such a manner that a conductive film originally having a predetermined shape is formed, not in such a manner that a conductive film is processed by etching, laser irradiation, or the like. As a way to form a conductive film having a predetermined shape, vapor formation using a metal mask, a droplet discharge method, or the like is given. Note that a droplet discharge method means a method of forming a conductive film having a predetermined shape by discharging or ejecting a droplet including a predetermined composition from an orifice. An inkjet method is given as one example.

Furthermore, roughness is formed on a surface of the conductive film 210, which is on a photoelectric conversion layer 211 side, so that light is refracted or reflected diffusely on the conductive film 210. Thus, light absorptance in the photoelectric conversion layer 211 is enhanced, and conversion efficiency can be improved.

Figure 3B:
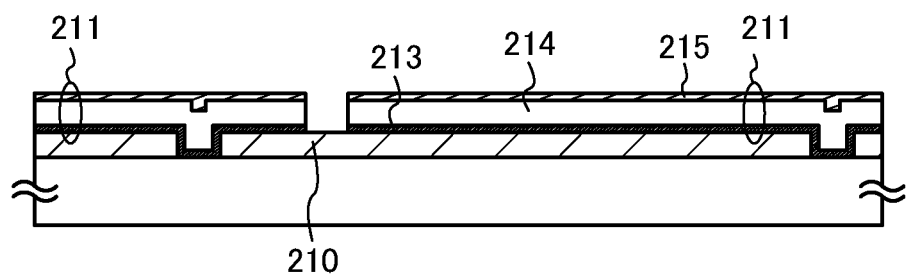

Then, over the conductive film 210, the photoelectric conversion layer 211 is formed in which an n-type semiconductor layer 213, an intrinsic semiconductor layer 214, and a p-type semiconductor layer 215 are stacked in this order (see FIG. 3B).

The n-type semiconductor layer 213, the intrinsic semiconductor layer 214, and the p-type semiconductor layer 215 can be formed by sputtering, LPCVD, plasma CVD, or the like. In addition, the n-type semiconductor layer 213, the intrinsic semiconductor layer 214, and the p-type semiconductor layer 215 can be formed using an amorphous semiconductor, a polycrystalline semiconductor, a microcrystalline semiconductor, or the like.

Further, it is preferable that the n-type semiconductor layer 213, the intrinsic semiconductor layer 214, and the p-type semiconductor layer 215 be successively formed without being exposed to the air so as to prevent dust or the like from being attached to their interface or to prevent oxidation.

Furthermore, a thin single crystal semiconductor film formed using an SOI method can be used for the n-type semiconductor layer 213, the intrinsic semiconductor layer 214, and the p-type semiconductor layer 215. When a thin single crystal semiconductor film is used, the photoelectric conversion layer 211 has a small number of crystal defects which become a factor for inhibiting transport of carriers. Thus, conversion efficiency can be increased.

In this embodiment, a microcrystalline semiconductor including silicon is used for the n-type semiconductor layer 213, an amorphous semiconductor including silicon is used for the intrinsic semiconductor layer 214, and an amorphous semiconductor including silicon carbide is used for the p-type semiconductor layer 215.

A manufacturing method of a microcrystalline semiconductor including silicon used for the n-type semiconductor layer 213 will be described below.

The microcrystalline semiconductor including silicon can be formed by high-frequency plasma-enhanced CVD with a frequency of several tens to several hundreds of megahertz or a microwave plasma CVD with a frequency higher than or equal to 1 GHz. Typically, when silicon hydride such as silane or disilane, silicon fluoride, or silicon chloride is diluted with hydrogen to be used, a microcrystalline semiconductor film can be formed. Further, silicon hydride, silicon fluoride, or silicon chloride may be diluted with hydrogen and one or more kinds of rare gases selected from helium, argon, krypton, and neon. The flow rate ratio of hydrogen to the compound including silicon, such as silicon hydride, in this case is set to be greater than or equal to 5:1 and less than or equal to 200:1, preferably greater than or equal to 50:1 and less than or equal to 150:1, more preferably 100:1.

An impurity element imparting n-type conductivity is added to a silicon-including gas, so that a microcrystalline semiconductor can have n-type conductivity. Phosphorus can be given as such an impurity element, for example. When phosphorus is used as an impurity element imparting n-type conductivity, phosphine or the like may be added to a silicon-including gas.

In this embodiment, the n-type semiconductor layer 213 having a thickness of 10 nm is formed by plasma CVD using a microcrystalline semiconductor including silicon under the following conditions: the flow rates of monosilane, hydrogen, and phosphine are 5 sccm, 950 sccm, and 40 sccm, respectively; the reaction pressure is 133 Pa; the substrate temperature is 250° C.; and a high frequency of 13.56 MHz is used.

A manufacturing method of an amorphous semiconductor including silicon used for the intrinsic semiconductor layer 214 will be described below.

The amorphous semiconductor including silicon can be obtained by glow discharge decomposition of the aforementioned gas including silicon.

In this embodiment, the intrinsic semiconductor layer 214, which is an amorphous semiconductor including silicon and has a thickness of 60 nm, is formed by plasma-enhanced CVD under the following conditions: the flow rates of monosilane and hydrogen are each 25 sccm; the reaction pressure is 40 Pa; the substrate temperature is 250° C.; and a high frequency of 60 MHz is used.

A manufacturing method of an amorphous semiconductor including silicon carbide used for the p-type semiconductor layer 215 will be described below.

The amorphous semiconductor including silicon carbide can be obtained by glow discharge decomposition of a gas including carbon and a gas including silicon. As the gas including carbon, $CH_4$, $C_2H_6$, and the like can be given. As the gas including silicon, $SiH_4$ or $Si_2H_6$ may be used. The gas including silicon diluted with hydrogen or hydrogen and helium may be used.

An impurity element imparting p-type conductivity is added to the gas including carbon and the gas including silicon, the amorphous semiconductor can have p-type conductivity. Boron is used as an impurity element imparting p-type conductivity, for example. When boron is used as an impurity element imparting p-type conductivity, one of or 2 or more of borane, diborane, and boron trifluoride may be added to the gas including carbon and the gas including silicon.

In this embodiment, the p-type semiconductor layer 215 which is a p-type amorphous semiconductor including silicon carbide and has a thickness of 10 nm is formed using plasma CVD under the following conditions: the flow rates of methane, monosilane, hydrogen, and diborane are 18 sccm, 6 sccm, 150 sccm, and 40 sccm, respectively; the reaction pressure is 67 Pa; the substrate temperature is 250° C.; and a high frequency of 13.56 MHz is used.

Note that before the intrinsic semiconductor layer 214 is formed, plasma treatment using hydrogen is performed on the surface of the n-type semiconductor layer 213, whereby the number of crystal defects at the interface between the n-type semiconductor layer 213 and the intrinsic semiconductor layer 214 can be reduced and conversion efficiency can be enhanced.

In this embodiment, plasma treatment is performed on the surface of the n-type semiconductor layer 213 under the following conditions: the flow rate of hydrogen is 175 sccm, the reaction pressure is 67 Pa, the substrate temperature is 250° C., and a high frequency of 13.56 MHz is used. In the plasma treatment, argon may be added to hydrogen. In the case where argon is added, the flow rate thereof can be, for example, 60 sccm.

As a semiconductor material used for the photoelectric conversion layer 211, germanium; a compound semiconductor such as gallium arsenide, indium phosphide, zinc selenide, gallium nitride, or silicon germanium can be used in addition to silicon or silicon carbide.

In the case where the photoelectric conversion layer 211 is formed using a polycrystalline semiconductor, the photoelectric conversion layer 211 can be formed in such a manner that an amorphous semiconductor film or a microcrystalline semiconductor film is crystallized by a laser crystallization method, a thermal crystallization method, a thermal crystallization method in which a catalytic element which promotes crystallization, such as nickel, is used, or the like alone, or by any of the above methods in combination. Alternatively, a polycrystalline semiconductor may be formed directly by sputtering, plasma-enhanced CVD, thermal CVD, or the like.

Note that in this embodiment, an example is described in which the n-type semiconductor layer 213, the intrinsic semiconductor layer 214, and the p-type semiconductor layer 215 are stacked in this order to form the photoelectric conversion layer 211; however, the order may be as follows: a p-type semiconductor layer, an intrinsic semiconductor layer, and an n-type semiconductor layer.

It is preferable that the p-type semiconductor layer be closer to the light delivered side than the n-type semiconductor layer. The life of a hole as a carrier is as short as approximately half of the life of an electron as a carrier. When light is delivered to the photoelectric conversion layer 211 having the PIN junction, a large amount of electrons and holes are formed in the intrinsic semiconductor layer, and the electrons move to the n-type semiconductor layer side and holes move to the p-type semiconductor layer side, so that electromotive force can be obtained.

When light is delivered from the p-type semiconductor layer side, a large number of electrons and holes are formed in a region in the intrinsic semiconductor layer, and the region is closer to the p-type semiconductor layer than to the n-type semiconductor layer. Accordingly, a distance to the p-type semiconductor layer to which the holes having short lifetime move can be shortened; as a result, high electromotive force can be obtained.

In this embodiment, light is delivered from both the p-type semiconductor layer side and the n-type semiconductor layer side. Therefore, the photoelectric conversion layer 211 may be formed by stacking the p-type semiconductor layer, the intrinsic semiconductor layer, and the n-type semiconductor layer in this order or by stacking the n-type semiconductor layer, the intrinsic semiconductor layer, and the p-type semiconductor layer in this order. Note that when the p-type semiconductor layer is provided on the side on which light with higher intensity is delivered, stronger electromotive force can be obtained.

Note that before the photoelectric conversion layer 211 is formed, brush cleaning, specifically, cleaning with the use of a polyvinyl alcohol (PVA)-based porous material or the like may be performed and a foreign substance may be removed in order to improve cleanliness of the surface of the conductive film 210. In addition, the surface may be cleaned using a chemical solution including hydrofluoric acid or the like. In this embodiment, the surface of the conductive film 210 is cleaned using the polyvinyl alcohol (PVA)-based porous material, and then the surface of the conductive film 210 is cleaned using 0.5% hydrogen fluoride solution.

Next, as illustrated in FIG. 3B, the photoelectric conversion layer 211 formed by stacking the n-type semiconductor layer 213, the intrinsic semiconductor layer 214, and the p-type semiconductor layer 215 in this order is separated for each cell by etching, laser irradiation, or the like.

The separated photoelectric conversion layers 211 are each electrically connected to the conductive films 210 through the n-type semiconductor layer 213.

Figure 3C:
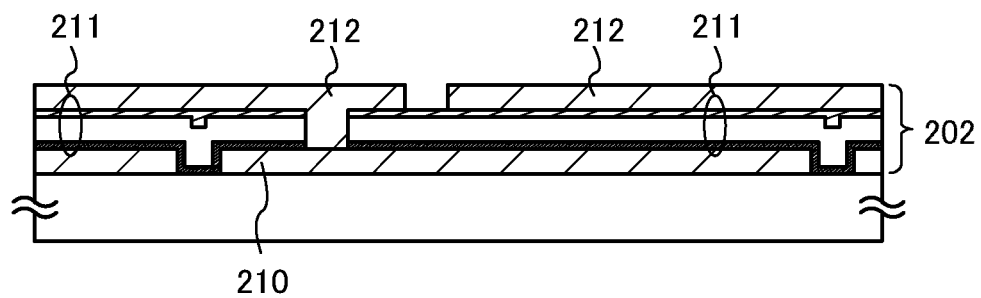

Then, as illustrated in FIG. 3C, conductive films 212 each with a predetermined shape are formed over the photoelectric conversion layers 211.

This embodiment shows an example of a photoelectric conversion element in which light is delivered also from the upper side of the photoelectric conversion layer 211. Accordingly, the transmissive conductive material is used for the conductive film 212 similarly as the conductive film 210. The conductive film 212 is formed so as to have a thickness of 40 nm to 800 nm, preferably 400 nm to 700 nm. In addition, the sheet resistance of the conductive film 212 may be approximately 20 Ω/square to 200 Ω/square. In this embodiment, the conductive film 212 with a thickness of approximately 600 nm is formed using tin oxide.

Note that in the case where an indium tin oxide is used for the conductive film 212, and the conductive film 212 is formed on the p-type semiconductor layer 215 including an amorphous semiconductor, hydrogen in the p-type semiconductor layer 215 reduces the indium tin oxide in the conductive film 212; therefore, film quality of the conductive film 212 can be degraded.

When indium tin oxide is used for the conductive film 212, in order to prevent indium tin oxide from being reduced, a film formed in the following manner is preferably used as the conductive film 212: a conductive film with a thickness of several tens of nanometers using tin oxide or using a conductive material including a mixed material of zinc oxide and aluminum nitride is stacked over the conductive film using indium tin oxide.

The conductive film 212 with a predetermined shape can be formed in such a manner that a conductive film is formed over the entire surface of the photoelectric conversion layer 211 and then processed. Note that the conductive film 212 can be formed not only in such a manner that a conductive film formed over the entire surface is processed by etching, laser irradiation, or the like, but also by vapor formation using a metal mask, a droplet discharge method, or the like.

The conductive film 212 is electrically connected to the photoelectric conversion layer 211 on the p-type semiconductor layer 215 side. Then, the conductive film 210 which is electrically connected to one photoelectric conversion layer 211 on the n-type semiconductor layer 213 side is electrically connected to the conductive film 212 which is electrically connected to the photoelectric conversion layer 211, which is different from the one photoelectric conversion layer 211, on the p-type semiconductor layer 215 side. In such a manner, each separated cell is connected to a different cell. Each cell is connected to a different cell in series, so that output voltage can be increased.

Through the steps, a photoelectric conversion element including the photoelectric conversion layer 211 is formed.

Next, examples of the converter circuit of this embodiment will be described with reference to FIGS. 4A and 4B. The converter circuit described in this embodiment is a DC-DC converter with which DC voltage is converted into DC voltage.

Note that the converter circuit of this embodiment is not limited to the following structures and can have any structure as long as it is a converter circuit formed using transmissive materials.

Figure 4A:
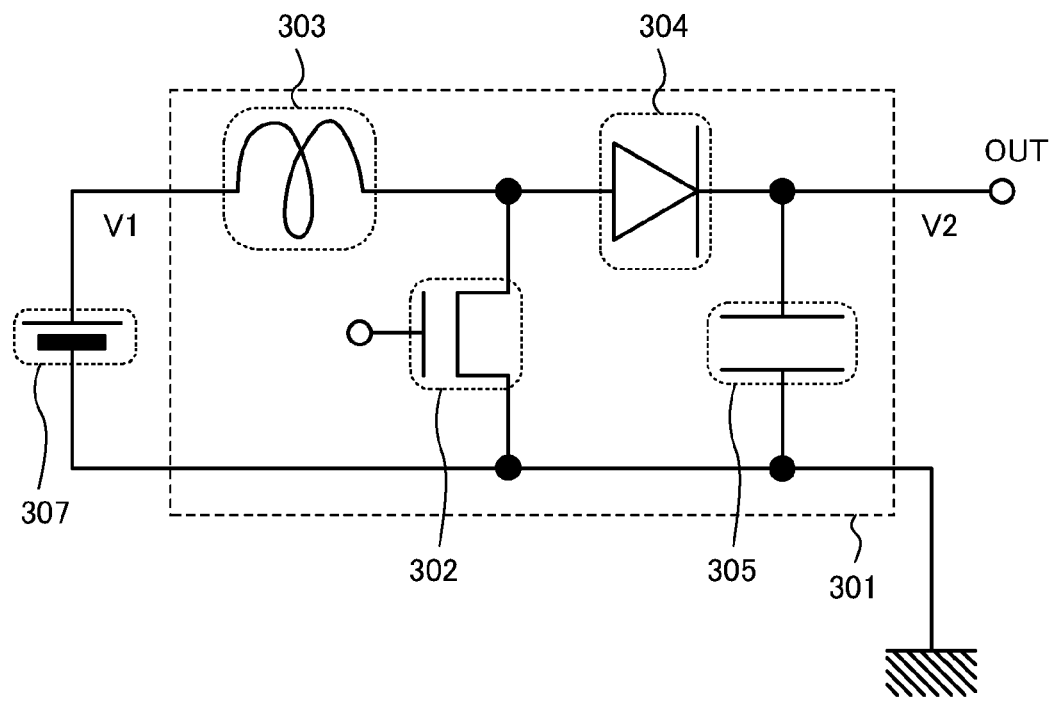
FIGS. 4A and 4B are circuit diagrams of converter circuits.

A converter circuit 301 illustrated in FIG. 4A is a step-up circuit including a transistor 302, a coil 303, a diode 304, and a capacitor 305.

One of terminals of the coil 303 is electrically connected to an electrode on a p-type semiconductor layer side of a photoelectric conversion element 307. The other of the terminals of the coil 303 is electrically connected to one of a source and a drain of the transistor 302. The one of the source and the drain of the transistor 302 is electrically connected to the other of the terminals of the coil 303 and an input terminal of the diode 304. The other of the source and the drain of the transistor 302 is electrically connected to an electrode on an n-type semiconductor layer side of the photoelectric conversion element 307 and one of terminals of the capacitor 305. The other of the terminals of the capacitor 305 is electrically connected to an output terminal of the diode 304 and an output terminal OUT. Note that the electrode on the n-type semiconductor layer side of the photoelectric conversion element 307, the other of the source and the drain of the transistor 302, and the one of the terminals of the capacitor 305 are grounded.

Note that a gate of the transistor refers to the entire gate electrode and gate wiring or part thereof. The gate wiring is a wiring for electrically connecting at least one gate electrode of a transistor to a different electrode or a different wiring.

The source of the transistor refers to the entire source region, source electrode, and source wiring or part thereof. The source region is a region whose resistance is lower than that of a channel formation region in a semiconductor layer. The source electrode indicates part of a conductive layer, which is connected to the source region. The source wiring is a wiring for electrically connecting at least one source electrode of a transistor to a different electrode or a different wiring.

The drain of the transistor refers to the entire drain region, drain electrode, and drain wiring or part thereof. The drain region is a region whose resistance is lower than that of a channel formation region in a semiconductor layer. The drain electrode indicates part of a conductive layer, which is connected to the drain region. The drain wiring is a wiring for electrically connecting at least one drain electrode of a transistor to a different electrode or a different wiring.

Further, a source and a drain of a transistor may interchange depending on the structure, the operating condition, or the like of the transistor; therefore, it is difficult to define which is a source or a drain. Therefore, in this document (the specification, the claims, the drawings, and the like), one of them is referred to as one of the source and the drain, and the other is referred to as the other of the source and the drain.

The transistor 302 functions as a switching element. A gate of the transistor 302 is connected to a control circuit of the converter circuit 301. The transistor 302 is turned on and off by a signal output from the control circuit of the converter circuit 301.

When the transistor 302 functioning as a switching element is on, the coil 303 accumulates excitation energy by current flowing to the coil 303.

When the transistor 302 is turned off, excitation energy accumulated in the coil 303 is released. A voltage V2 due to excitation energy released from the coil 303 is added to a voltage V1. Thus, the converter circuit 301 functions as a step-up circuit.

It is defined that a period in which the transistor 302 functioning as a switching element is on is denoted by $T_{on}$ and a period in which the transistor 302 is off is denoted by $T_{off}$. A value of the output voltage V2 is expressed by the following (Formula 1).

$$V2 = V1 \times (T_{on} + T_{off})/T_{off} \qquad \text{(Formula 1)}$$

The longer the period $T_{on}$ in which the transistor 302 is on becomes and the larger energy accumulated in the coil 303 becomes, the larger power to be obtained becomes.

Note that in this embodiment, a field effect transistor can be used as the transistor 302 or a transistor 312, for example.

A field effect transistor has at least a gate, a source, and a drain. As the field effect transistor, a thin film transistor (also referred to as a TFT) can be used, for example. Moreover, the field effect transistor can have a top-gate structure or a bottom-gate structure, for example. Further, the field-effect transistor can have n-type conductivity.

In addition, the field-effect transistor of this embodiment is a transistor which includes an oxide semiconductor film having a function as a channel formation region. Note that the hydrogen concentration in the channel formation region is lower than or equal to $5 \times 10^{19}$ atoms/cm$^3$, preferably, lower than or equal to $5 \times 10^{18}$ atoms/cm$^3$, more preferably, lower than or equal to $5 \times 10^{17}$ atoms/cm$^3$. The hydrogen concentration is measured using secondary ion mass spectrometry (SIMS), for example. The carrier concentrations of the transistors are $1 \times 10^{14}$/cm$^3$ or lower, preferably $1 \times 10^{12}$/cm$^3$ or lower.

Further, in this embodiment, a wiring formed over a substrate to have the coil shape may be used as the coil 303.

Furthermore, in this embodiment, a Schottky-barrier diode can be used as the diode 304, for example.

Moreover, in this embodiment, a capacitor including a first electrode, a second electrode, and a dielectric can be used as the capacitor 305, for example.

Figure 4B:
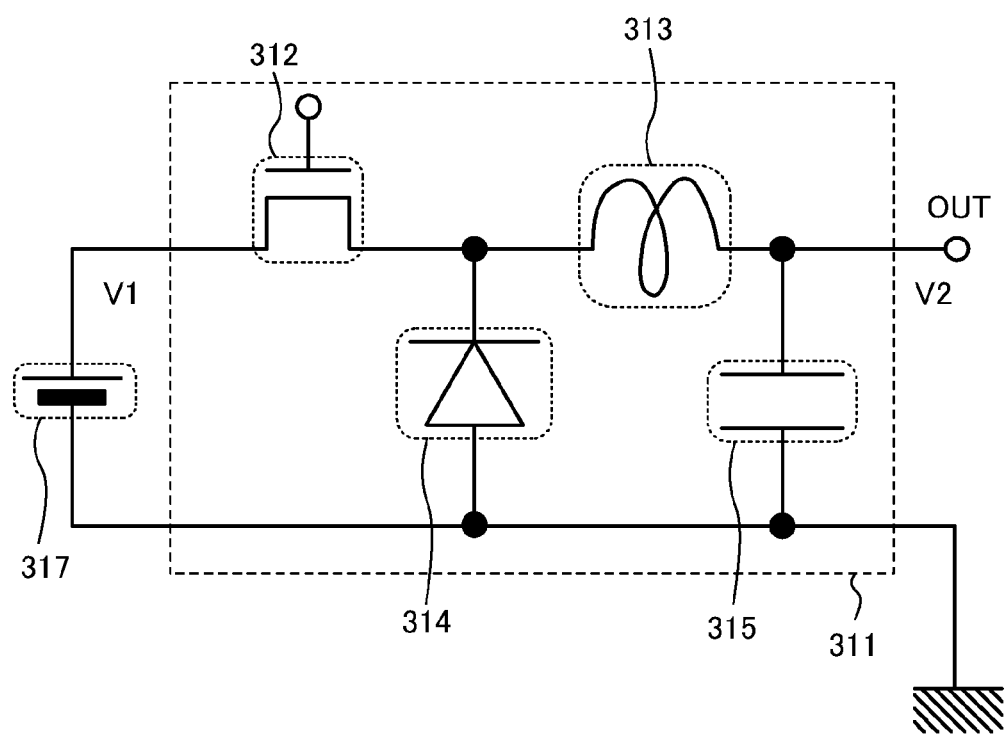

A converter circuit 311 illustrated in FIG. 4B is a step-down circuit including the transistor 312, a coil 313, a diode 314, and a capacitor 315.

One of a source and a drain of the transistor 312 is electrically connected to an electrode on a p-type semiconductor layer side of a photoelectric conversion element 317. The other of the source and the drain of the transistor 312 is electrically connected to an output terminal of the diode 314 and one of terminals of the coil 313. An input terminal of the diode 314 is electrically connected to an electrode on an n-type semiconductor layer side of the photoelectric conversion element 317 and one of terminals of the capacitor 315. The output terminal of the diode 314 is electrically connected to the other of the source and the drain of the transistor 312 and the one of the terminals of the coil 313. The one of the terminals of the coil 313 is electrically connected to the other of the source and the drain of the transistor 312 and the output terminal of the diode 314. The other of terminals of the coil 313 is electrically connected to the other of the terminals of the capacitor 315 and the output terminal OUT. Note that the electrode on the n-type semiconductor layer side of the photoelectric conversion element 317, the input terminal of the diode 314, and the one of the terminals of the capacitor 315 are grounded.

The transistor 312 functions as a switching element. A gate of the transistor 312 is connected to a control circuit of the converter circuit 311. The transistor 312 is turned on and off by a signal output from the control circuit of the converter circuit 311.

When the transistor 312 functioning as a switching element is on, the coil 313 accumulates excitation energy by current flowing from the electrode on the p-type semiconductor layer side of the photoelectric conversion element 317 to the output terminal OUT.

When the transistor 312 is turned off, the coil 313 generates electromotive force to keep current flowing, so that the diode 314 is turned on. Current flows through the diode 314, and the voltage is decreased to be V2. The voltage V2 becomes lower than the voltage V1; thus, the converter circuit 311 functions as a step-down circuit.

Note that in this embodiment, a field effect transistor can be used as the transistor 312, for example.

Further, in this embodiment, a wiring formed over a substrate to have the coil shape may be used as the coil 313

Furthermore, in this embodiment, a Schottky-barrier diode can be used as the diode 314, for example.

Moreover, in this embodiment, a capacitor including a first electrode, a second electrode, and a dielectric can be used as the capacitor 315, for example.

The transistor 302 or the transistor 312 is a field effect transistor and has a channel formation region including an oxide semiconductor film. A transistor having a channel formation region including an oxide semiconductor film is preferable because an oxide semiconductor film is transmissive.

As an example of the transistor 302 or the transistor 312, a transistor 410 described below is given. A structure and a manufacturing method of the transistor 410 are described with reference to FIGS. 5A and 5B and FIGS. 6A to 6E.

Figure 5A:
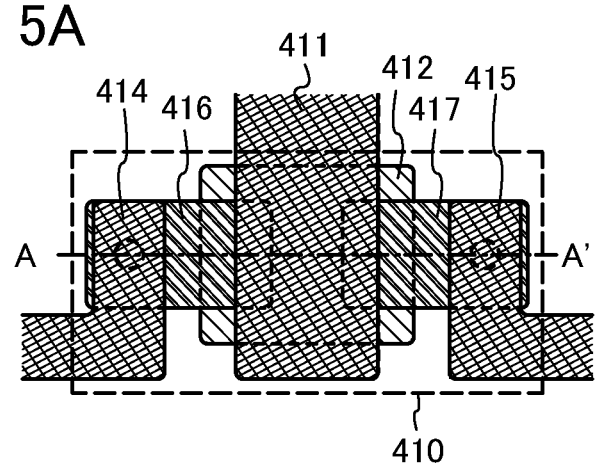
FIG. 5A is a top view and FIG. 5B is a cross-sectional view of a transistor.
Figure 5B:
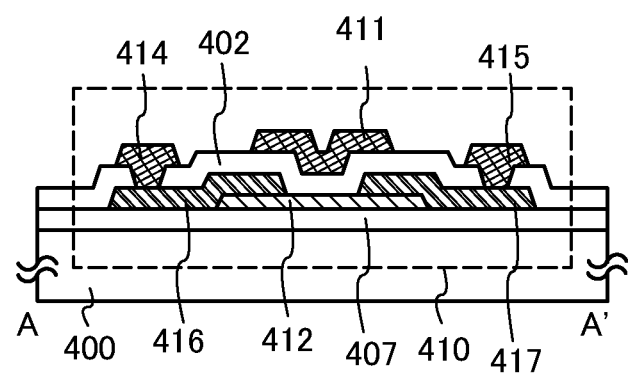

First, FIGS. 5A and 5B illustrate examples of a plane structure and a cross-sectional structure of the transistor 410, respectively. FIG. 5A is a plane view of the transistor 410 having a top gate structure and FIG. 5B is a cross-sectional view along line A-A' in FIG. 5A.

The transistor 410 includes an insulating film 407, an oxide semiconductor film 412, an electrode 416 which is one of a source electrode and a drain electrode, an electrode 417 which is the other of the source electrode and the drain electrode, a gate insulating film 402, and a gate electrode 411, over a substrate 400. In addition, a wiring layer 414 and a wiring layer 415 are electrically connected to and in contact with the electrode 416 and the electrode 417, respectively. The transistor 410 can be referred to as a top-contact transistor because the electrode 416 and the electrode 417 which are the source electrode and the drain electrode are in contact with the top surface of the oxide semiconductor film 412 which is the channel formation region.

The oxide semiconductor film 412 functions as the channel formation region. As described above, the oxide semiconductor film 412 is transmissive. With the transmissive oxide semiconductor film 412, light can reach to the photoelectric conversion layer 211, which is preferable.

Note that although the transistor 410 in FIG. 5A has a single-gate structure, this embodiment is not limited thereto. The transistor may be a multi-gate transistor including a plurality of gate electrodes and a plurality of channel formation regions.

An oxide semiconductor film functioning as the channel formation region of the transistor 410 is preferably a high-purity oxide semiconductor film. The features and advantages of a transistor including a high-purity oxide semiconductor film will be described below.

In the high-purity oxide semiconductor film, the number of impurities adversely affecting the electric characteristics of the transistor using an oxide semiconductor is reduced to an extremely low level. As a typical example of impurities which adversely affect the electric characteristics, hydrogen is given.

A hydrogen atom may act as a donor, which provides carriers in an oxide semiconductor film. An oxide semiconductor film becomes n-type in the case of including a large amount of hydrogen.

A transistor including an oxide semiconductor film which includes a large amount of hydrogen is normally on. In addition, the on/off ratio of the transistor cannot be high enough.

Therefore, in this specification, a "high-purity oxide semiconductor" is an intrinsic or substantially intrinsic oxide semiconductor film in which hydrogen is reduced as much as possible. An example of the high-purity oxide semiconductor is an oxide semiconductor film whose carrier concentration is lower than $1 \times 10^{14}/cm^3$, preferably lower than $1 \times 10^{12}/cm^3$, more preferably lower than $1 \times 10^{11}/cm^3$ or lower than $6.0 \times 10^{10}/cm^3$.

A transistor including a high-purity oxide semiconductor which is obtained by drastic removal of hydrogen included in an oxide semiconductor film for a channel formation region has much lower off-state current than a transistor including silicon for a channel formation region, for example.

Further, in this embodiment, a transistor including a high-purity oxide semiconductor film is described below as an n-channel transistor.

Note that in this specification, off-state current (also referred to as leakage current) means a current flowing between the source and the drain of a transistor when a predetermined voltage between −20 V and −5 V is applied to the gate of the transistor at room temperature, in the case where the transistor is an n-channel transistor whose threshold voltage Vth has a positive value. Note that the room temperature is 15° C. to 25° C. In a transistor using an oxide semiconductor film according to the present invention, at room temperature, the current value per micrometer of channel width (w) is 100 zA/μm or lower, and preferably 10 zA/μm or lower.

Note that if the amount of the off-state current and the level of the drain voltage are known, resistance when the transistor is off (off resistance R) can be calculated obeying Ohm's law. If a cross-section area A of the channel formation region and the channel length L are known, off-state resistivity p can be calculated from the formula $\rho = RA/L$ (R indicates off resistance). The off-state resistivity is preferably higher than or equal to $1 \times 10^9$ Ω·m (or $1 \times 10^{10}$ Ω·m). Here, the cross-section area A can be calculated from the formula A=dW (d: the thickness of the channel formation region, W: the channel width).

In addition, the energy gap of the oxide semiconductor film is 2 eV or more, preferably 2.5 eV or more, more preferably 3 eV or more.

Moreover, the transistor including a high-purity oxide semiconductor film has favorable temperature characteristics. Typically, in the temperature range of from −25° C. to 150° C., the current-voltage characteristics of the transistor, such as on-state current, off-state current, field-effect mobility, a subthreshold value (an S value), and threshold voltage, hardly change and deteriorate due to temperature.

Next, hot-carrier degradation of a transistor including an oxide semiconductor film will be described.

The hot-carrier degradation corresponds to a phenomenon where, in a channel and in the vicinity of a drain, highly-accelerated electrons are injected into a gate oxide film and then become fixed charges; or to a phenomenon where highly-accelerated electrons form a trap level at the interface between an oxide semiconductor film and a gate insulating film, which involves deterioration of transistor characteristics, e.g., variations in threshold voltage or gate leakage. The hot-carrier degradation is caused by channel-hot-electron injection (also referred to as CHE injection) or drain-avalanche-hot-carrier injection (also referred to as DAHC injection).

Since the band gap of silicon is as small as 1.12 eV, electrons are likely to be generated like an avalanche owing to an avalanche breakdown, and electrons that are accelerated to be so rapid as to go over a barrier to the gate insulating film are increased in number. On the other hand, the oxide semiconductor film described in this embodiment has a wide band gap of 3.15 eV; therefore, the avalanche breakdown is unlikely to occur and resistance to the hot-carrier degradation is higher than that of silicon.

Note that the band gap of silicon carbide which is one of materials having a high withstand voltage and the band gap of the oxide semiconductor are equal to each other. However, electrons are less likely to be accelerated in an oxide semiconductor because the mobility in an oxide semiconductor is smaller than that of silicon carbide. Further, a barrier between an oxide semiconductor and an oxide film that is a gate insulating film is larger than a barrier between any of silicon carbide, gallium nitride, or silicon and an oxide film that is a gate insulating film; therefore, in an oxide semiconductor, the number of electrons injected to the oxide film is extremely small. Thus, hot-carrier degradation is less likely to occur in an oxide semiconductor as compared to silicon carbide, gallium nitride, or silicon, and it can be said that drain withstand voltage is high. Therefore, it is not necessary to intentionally form low-concentration impurity regions between an oxide semiconductor functioning as a channel and a source and drain electrodes, so that the structure of the transistor can be significantly simplified and the number of manufacturing steps can be reduced.

As described above, the transistor including the oxide semiconductor has high drain withstand voltage; specifically, such a transistor can have a drain withstand voltage of greater than or equal to 100 V, preferably greater than or equal to 500 V, more preferably greater than or equal to 1 kV.

The oxide semiconductor has an excellent visible light transmittance. Therefore, a transistor including such a transmissive oxide semiconductor film as a channel formation region does not prevent visible light from reaching a photoelectric conversion element even in the case where the transistor is formed to be overlapped with the photoelectric conversion element.

Next, a manufacturing process of the transistor 410 will be described with reference to FIGS. 6A to 6E.

First, the substrate 400 is prepared. The substrate 400 corresponds to the substrate 111. A material transmissive with respect to sunlight is used for the substrate 400, assuming that light delivered to the transistor 410 from the substrate 400 side.

As the transmissive substrate 400, for example, a glass plate of soda-lime glass, clear glass, lead glass, tempered glass, and ceramic glass can be used. Further, a non-alkali glass substrate of aluminosilicate glass, barium borosilicate glass, aluminoborosilicate glass, or the like; a quartz substrate; or a ceramic substrate can be used.

As the transmissive substrate 400, a substrate made of a synthetic resin having flexibility such as plastics (plastic substrate), which generally has the heat-resistance temperature lower than those of the above-described substrates, can be used as long as it can withstand the process temperature in a manufacturing process.

As a plastic substrate, polyester; polyethersulfone (PES); polyethylene naphthalate (PEN); polycarbonate (PC); a polyamide synthetic fiber; polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; and the like can be given. Polyethylene terephthalate (PET) can be given as polyester, for example.

The insulating film 407 serving as a base film is formed over the substrate 400.

As the insulating film 407, an oxide insulating film such as a silicon oxide film, a silicon oxynitride film, an aluminum oxide film, or an aluminum oxynitride film is preferably used. The insulating film 407 can be formed by plasma CVD, sputtering, or the like. In order to prevent the insulating film 407 from including a large amount of hydrogen, the insulating film 407 is preferably formed by sputtering.

In this embodiment, a silicon oxide film is formed as the insulating film 407 by sputtering. Specifically, the substrate 400 is transferred to a process chamber and a sputtering gas which contains high-purity oxygen and from which hydrogen and moisture have been removed is introduced, and a target of silicon or silicon oxide is used, thus forming a silicon oxide layer as the insulating film 407 over the substrate 400. Note that the substrate 400 may be kept at room temperature or may be heated during formation.

A specific example of a formation condition for a silicon oxide film is as follows: quartz (preferably, synthetic quartz) is used as the target; the substrate temperature is 108° C.; the distance between a target and the substrate 400 (T-S distance) is 60 mm; the pressure is 0.4 Pa; the high-frequency power is 1.5 kW; the atmosphere is oxygen and argon (the flow rate of oxygen and argon is 25 sccm:25 sccm=1:1); and RF sputtering is performed. The thickness of the silicon oxide film is 100 nm in this embodiment. Note that a silicon target may be used as the target instead of the quartz (preferably, synthetic quartz) target. Further, an oxygen gas may be used as a sputtering gas instead of a mixed gas of oxygen and argon. Here, a sputtering gas for forming the insulating film 407 is a high-purity gas in which impurities such as hydrogen, water, hydroxyl, or hydride are reduced to such a level that the concentration thereof can be expressed by ppm or ppb.

Further, it is preferable that the insulating film 407 be formed while moisture remaining in the process chamber is removed so that the insulating film 407 may be prevented from including hydrogen, water, hydroxyl, hydride, and the like.

In order to remove moisture remaining in the process chamber, a capture-type vacuum pump may be used. For example, a cryopump, an ion pump, or a titanium sublimation pump can be used. Further, as an evacuation unit, a turbo pump provided with a cold trap is preferably used in combination. A formation chamber which is evacuated with a cryopump is preferable because hydrogen atoms, compounds including a hydrogen atom such as water ($H_2O$), or the like are exhausted from the formation chamber and hydrogen atoms are thus hardly included in the insulating film 407 deposited in the formation chamber.

Examples of sputtering include RF sputtering in which a high-frequency power source is used for a sputtering power source, DC sputtering, and pulsed DC sputtering in which a bias is applied in a pulsed manner. RF sputtering is mainly performed in the case where an insulating film is formed, and DC sputtering is mainly performed in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Further, a sputtering apparatus provided with a magnet system inside the chamber and used for magnetron sputtering, or a sputtering apparatus used for ECR sputtering in which plasma generated with the use of microwaves is used without using glow discharge can be used.

Further, as a formation method using sputtering, there are also reactive sputtering in which a target substance and a sputtering gas component are chemically reacted with each other during the formation to form a thin compound film thereof, and bias sputtering in which voltage is also applied to a substrate during the formation.

The structure of the insulating film 407 is not limited to a single-layer structure and may be a stacked-layer structure. For example, the insulating film 407 may have a layered structure in which a nitride insulating film such as a silicon nitride film, silicon nitride oxide film, an aluminum nitride film, or an aluminum nitride oxide film and the above oxide insulating film are stacked in that order from the substrate 400 side.

For example, a sputtering gas including high-purity nitrogen is introduced and a silicon nitride film is deposited over the substrate using a silicon target. Then, the sputtering gas is changed from a gas including high-purity nitrogen to a gas including high-purity oxygen gas, and a silicon oxide film is deposited. In this step also, it is preferable that a silicon nitride film or a silicon oxide film be deposited while moisture remaining in the process chamber is removed as in the above-described case. Further, the substrate may be heated during formation.

Then, an oxide semiconductor film is formed over the insulating film 407 by sputtering.

Further, in order that hydrogen, hydroxyl, and moisture be included in the oxide semiconductor film as little as possible, it is preferable that the substrate 400 over which the insulating film 407 is formed be preheated in a preheating chamber of a sputtering apparatus as pretreatment for the film formation so that impurities such as hydrogen and moisture adsorbed to the substrate 400 may be removed and evacuated. Note that a cryopump is preferably provided as an evacuation unit in the preheating chamber because a hydrogen atom, a compound including a hydrogen atom such as water ($H_2O$), or the like is to be evacuated. Further, this preheating may be performed on the substrate 400 before the formation of the gate insulating film 402, which is to be formed later. Further, this preheating is preferably performed similarly on the substrate 400 over which layers up to the first electrode 416 and the second electrode 417 are formed. Note that this preheating treatment may be omitted.

Note that before the oxide semiconductor film is formed by sputtering, dust attached to a surface of the insulating film 407 is preferably removed by reverse sputtering in which an argon gas is introduced and plasma is generated. The reverse sputtering refers to a method in which a high-frequency power source is used for application of voltage to a substrate in an argon atmosphere in order to generate plasma in the vicinity of the substrate to modify a surface. Note that instead of an argon atmosphere, nitrogen, helium, oxygen, or the like may be used.

As a target used for forming the oxide semiconductor film, a target of a metal oxide including zinc oxide as a main component can be used. As examples of the target, a target having a composition ratio of $In_2O_3:Ga_2O_3:ZnO=1:1:1$ (molar ratio), a target having a composition ratio of $In_2O_3:Ga_2O_3:ZnO=1:1:2$ (molar ratio), a target having a composition ratio of $In_2O_3:Ga_2O_3:ZnO=1:1:4$ (molar ratio), or the like can be used. The filling rate of the target including In, Ga, and Zn is larger than or equal to 90% to smaller than or equal to 100%, preferably larger than or equal to 95% and smaller than 100%. With the use of the target with high filling rate, a dense oxide semiconductor film is formed.

Note that the oxide semiconductor film may be formed in a rare gas (typically, argon) atmosphere, an oxygen atmosphere, or a mixed atmosphere of a rare gas and oxygen. Here, a sputtering gas for forming the oxide semiconductor film is a high-purity gas in which impurities such as hydrogen, water, hydroxyl, or hydride are reduced to such a level that the concentration thereof can be expressed by ppm or ppb.

The oxide semiconductor film is formed over the substrate 400 in such a manner that the substrate is held in a process chamber maintained under reduced pressure, a sputtering gas from which hydrogen and moisture have been removed is introduced while moisture remaining in the process chamber is removed, and metal oxide is used as a target. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the formation chamber which is evacuated with the cryopump, a hydrogen atom, a compound including a hydrogen atom, such as water ($H_2O$), (more preferably, also a compound including a carbon atom), and the like are removed, whereby the concentration of impurities in the oxide semiconductor film formed in the formation chamber can be reduced. Further, the substrate temperature can be kept at room temperature or can be increased to a temperature lower than 400° C. during the formation of the oxide semiconductor film.

As an example of the formation condition of the oxide semiconductor film, the following condition can be given: the temperature of the substrate is room temperature; the distance between the substrate and the target is 110 mm; the pressure is 0.4 Pa; the direct current (DC) power source is 0.5 kW; and the atmosphere is oxygen and argon (the flow rate of oxygen and argon is 15 sccm:30 sccm (=1:2)). Note that a pulse direct current (DC) power source is preferable because dust can be reduced and the film thickness can be uniform. The thickness of the oxide semiconductor film is preferably larger than or equal to 2 nm and smaller than or equal to 200 nm, preferably larger than or equal to 5 nm and smaller than or equal to 30 nm Note that an appropriate thickness of the oxide semiconductor layer varies depending on the material; therefore, the thickness may be determined as appropriate depending on the material.

In the above description, the oxide semiconductor is formed using In—Ga—Zn—O based oxide that is ternary metal oxide, but the oxide semiconductor can alternatively be any one of an In—Sn—Ga—Zn—O material that is a quaternary metal oxide; an In—Sn—Zn—O material, In—Al—Zn—O material, an Sn—Ga—Zn—O material, an Al—Ga—Zn—O material, or an Sn—Al—Zn—O material that are ternary metal oxides; an In—Zn—O material, an Sn—Zn—O material, an Al—Zn—O material, a Zn—Mg—O material, an Sn—Mg—O material, an In—Ga—O material, or an In—Mg—O material that are binary metal oxides; an In—O material; an Sn—O material; a Zn—O material; and the like. These oxide semiconductors may include Si. These oxide semiconductor layers may be amorphous or crystalline. Further, these oxide semiconductor layers may be non-single-crystal or single crystal. Note that in this specification, a ternary metal oxide is a metal oxide including three metal elements in addition to an oxygen (O) element. Similarly, a quaternary metal oxide is a metal oxide including four metal elements in addition to an oxygen (O) element, and a binary metal oxide is a metal oxide including two metal elements in addition to an oxygen (O) element.

As the oxide semiconductor film, a thin film represented by $InMO_3 (ZnO)_m$ (m>0) can also be used. Here, M represents one or more metal elements selected from Zn, Ga, Al, Mn, and Co. For example, Ga, Ga and Al, Ga and Mn, or Ga and Co can be given as M.

Figure 6A:
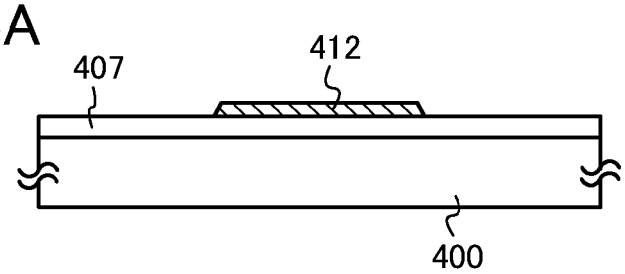
FIGS. 6A to 6E are cross-sectional views showing manufacturing process of the transistor.

Next, the oxide semiconductor film is processed into the island-shaped oxide semiconductor film 412 through a first photolithography process (see FIG. 6A). Note that a resist mask for forming the island-shaped semiconductor film 412 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching.

In the case of dry etching, parallel plate reactive ion etching (RIE) or inductively coupled plasma (ICP) etching can be performed. In order to etch the films into desired shapes, the etching condition (the amount of power applied to a coil-shaped electrode, the amount of power applied to an electrode on a substrate side, the temperature of the electrode on the substrate side, or the like) is adjusted as appropriate.

As an etching gas used for dry etching, a gas including chlorine (a chlorine-based gas such as chlorine ($Cl_2$), boron trichloride ($BCl_3$), silicon tetrachloride ($SiCl_4$), or carbon tetrachloride ($CCl_4$)) is preferable; however, a gas including fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As an etchant used for wet etching, a solution obtained by mixing phosphoric acid, acetic acid, and nitric acid, an ammonia peroxide mixture (31 wt % hydrogen peroxide water:28 wt % ammonia water:water=5:2:2), or the like can be used. In addition, ITO07N (produced by KANTO CHEMICAL CO., INC.) may also be used. The etching conditions (e.g., an etchant, an etching period, and a temperature) may be adjusted as appropriate in accordance with a material of the oxide semiconductor.

In the case of wet etching, an etchant is removed together with the material which is etched off by cleaning. The waste liquid including the etchant and the material etched off may be purified and the material may be reused. When a material (e.g., a rare metal such as indium) included in the oxide semiconductor film is collected from the waste liquid after the etching and reused, the resources can be efficiently used.

In this embodiment, the oxide semiconductor film is processed into the island-shaped oxide semiconductor film 412 by wet etching with the use of a solution where phosphoric acid, acetic acid, and nitric acid are mixed as an etchant.

Then, the first heat treatment is performed on the oxide semiconductor film 412. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor film 412 in a nitrogen atmosphere at 450° C. for one hour, and then, the oxide semiconductor film 412 is not exposed to the air so that entry of water and hydrogen into the oxide semiconductor layer is prevented; thus, the oxide semiconductor film 412 is obtained. By this first heat treatment, hydrogen, water, hydroxyl, and the like can be removed from the oxide semiconductor film 412.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas (typically, a rare gas such as argon) or a nitrogen gas can be used.

For example, as the first heat treatment, GRTA by which the substrate is moved into an inert gas heated to a high temperature as high as 650° C. to 700° C., heated for several minutes, and moved out of the inert gas heated to the high temperature may be performed. GRTA enables high-temperature heat treatment for a short time.

In the first heat treatment, it is preferable that water, hydrogen, and the like be not included in the atmosphere. In addition, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

Note that depending on the condition of the first heat treatment or the material of the oxide semiconductor film, the island-shaped oxide semiconductor film 412 might be crystallized by the first heat treatment and the crystal structure of the island-shaped oxide semiconductor film 412 might be a microcrystalline structure or a polycrystalline structure. For example, the oxide semiconductor film may crystallize to become a microcrystalline oxide semiconductor layer having a crystallinity of 80% or more.

Note that even when the first heat treatment is performed, the island-shaped oxide semiconductor film 412 might be an amorphous oxide semiconductor film without crystallization. The oxide semiconductor film may become an oxide semiconductor film in which a microcrystalline portion (with a grain diameter of 1 nm to 20 nm (typically, 2 nm to 4 nm)) is mixed into the amorphous oxide semiconductor film.

In addition, the first heat treatment performed on the semiconductor film, may be performed on the oxide semiconductor film before being processed into island-shaped oxide semiconductor films. In that case, after the first heat treatment, the substrate is taken out of the heat treatment apparatus and subjected to the first photolithography process. In addition, the first heat treatment can be performed either after the source electrode and the drain electrode are stacked over the oxide semiconductor film, or after the gate insulating film is formed over the source electrode and the drain electrode.

Although the first heat treatment is performed mainly for the purpose of removing impurities such as hydrogen, water, and a hydroxyl group from the oxide semiconductor film, oxygen defects might be generated in the oxide semiconductor film in the first heat treatment. Therefore, the first heat treatment is preferably followed by treatment for supplying oxygen. Specifically, heat treatment in oxygen atmosphere or an atmosphere including nitrogen and oxygen (e.g., nitrogen to oxygen is 4 to 1 in volume ratio) may be performed as the treatment for supplying oxygen after the first heat treatment, for example.

The first heat treatment is effective in dehydrating or dehydrogenating the oxide semiconductor film.

Next, a conductive film is formed over the insulating film 407 and the oxide semiconductor film 412. The conductive film may be formed by sputtering or vacuum evaporation.

The conductive film is necessarily formed using a transmissive conductive film. That is because light delivered from the substrate 400 (corresponding to the substrate 111) side is delivered to the photoelectric conversion layer through the conductive film. As such a transmissive conductive film, a conductive metal oxide film can be given. Examples of the conductive metal oxide include indium oxide ($In_2O_3$), tin oxide ($SnO_2$), zinc oxide (ZnO), an indium oxide-tin oxide alloy, an indium oxide-zinc oxide alloy ($In_2O_3$—ZnO), and the metal oxide material including silicon or silicon oxide. Further, the conductive film may have a single-layer structure or a stacked-layer structure of two or more layers.

Figure 6B:
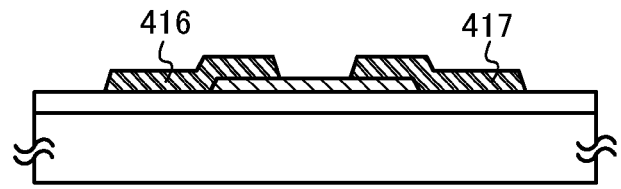

Then, by a second photolithography process, a resist mask is formed over the conductive film, and selective etching is performed, whereby the first electrode 416 and the second electrode 417 are formed, and then, the resist mask is removed (see FIG. 6B). The first electrode 416 serves as one of a source electrode and a drain electrode while the second electrode 417 serves as the other of the source electrode and the drain electrode. Here, end portions of the first electrode 416 and the second electrode 417 are preferably etched so as to be tapered because coverage with the gate insulating film stacked thereover is improved. Note that resist mask for forming the first electrode 416 and the second electrode 417 may be formed by an ink jet method. Formation of the resist mask by an inkjet method needs no photomask; thus, manufacturing cost can be reduced.

In addition, when the substrate 400 is large, the area occupied by a transistor formed through a process described later can be large, which is preferable. When the area occupied by the transistor is large, the channel width W of the transistor can be large; therefore, the current capability can be improved.

Figure 6C:
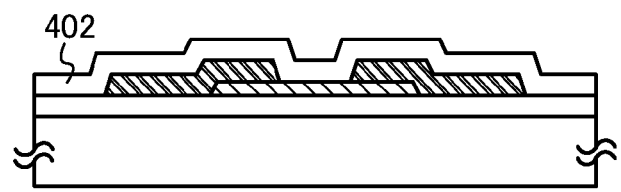

Then, the gate insulating film 402 is provided over the insulating film 407, the oxide semiconductor film 412, the first electrode 416, and the second electrode 417 (see FIG. 6C).

The gate insulating layer 402 is formed by plasma CVD, sputtering, or the like. The gate insulating film 402 can be formed to have a single-layer structure or a stacked-layer structure having a silicon oxide film, a silicon nitride film, a silicon oxynitride film, a silicon nitride oxide film, and/or an aluminum oxide film.

The gate insulating film 402 is preferably formed in such a manner that hydrogen is not included therein. In view of this, the gate insulating film 402 is preferably deposited by sputtering in which hydrogen in an atmosphere used for the formation can be minimized In the case of forming a silicon oxide film by sputtering, a silicon target or a quartz target is used as a target, and oxygen or a mixed gas of oxygen and argon is used as a sputtering gas.

The gate insulating film 402 can have a structure in which a silicon oxide film and a silicon nitride film are stacked in this order from the substrate 400 side. For example, a gate insulating film having a total thickness of 100 nm may be formed in such a manner that a silicon oxide film ($SiO_x$ (x>0)) with a thickness of greater than or equal to 5 nm and less than or equal to 300 nm is formed as a first gate insulating film and a silicon nitride film ($SiN_y$ (y>0)) with a thickness of greater than or equal to 50 nm and less than or equal to 200 nm is stacked over the first gate insulating film as a second gate insulating film. In this embodiment, a 100-nm-thick silicon oxide film is formed by RF sputtering under a condition that the pressure is 0.4 Pa, the high-frequency power is 1.5 kW, and an atmosphere including oxygen and argon (an oxygen flow of 25 sccm:an argon flow of 25 sccm=1:1) is used.

Figure 6D:
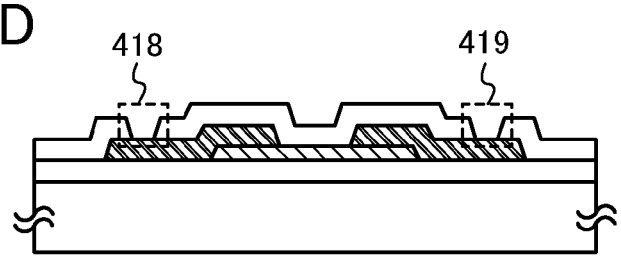

Next, a third photolithography process is performed to form a resist mask, and etching is selectively performed to remove part of the gate insulating film 402, so that openings 418 and 419 reaching the first electrode 416 and the second electrode 417, respectively, are formed (see FIG. 6D). Note that the formation of the resist mask by an ink jet method does not use a photomask; thus, manufacturing cost can be reduced.

Then, after a conductive film is formed over the gate insulating layer 402 and in the openings 418 and 419, the gate electrode 411 and the wiring layers 414 and 415 are formed in a fourth photolithography process.

The gate electrode 411, the wiring layer 414, and the wiring layer 415 are formed using a transmissive conductive film.

The gate electrode 411, the wiring layer 414, and the wiring layer 415 are necessarily formed using a transmissive conductive film. That is because light delivered from the substrate 400 (corresponding to the substrate 111) side is delivered to the photoelectric conversion layer through the conductive film.

As the transmissive conductive film, a conductive metal oxide film can be given. Examples of the conductive metal oxide include indium oxide ($In_2O_3$), tin oxide ($SnO_2$), zinc oxide (ZnO), an indium oxide-tin oxide alloy, an indium oxide-zinc oxide alloy ($In_2O_3$—ZnO), and the metal oxide material including silicon or silicon oxide. Further, the conductive film may have a single-layer structure or a stacked-layer structure of two or more layers.

Next, second heat treatment (preferably at 200° C. or higher and 400° C. or lower, for example, 250° C. or higher and 350° C. or lower) is performed in an inert gas atmosphere or an oxygen gas atmosphere. In this embodiment, the second heat treatment is performed at 250° C. for 1 hour in a nitrogen atmosphere. Note that the second heat treatment can be performed after a protective insulating film or a planarization insulating film is formed over the transistor 410.

Heat treatment may be further performed at 100° C. or higher and 200° C. or lower in air for 1 hour or more and 30 hours or less. This heat treatment can be performed at a fixed heating temperature or follow temperature cycles where the temperature repeatedly rises from room temperature to a heating temperature of 100° C. or higher and 200° C. or lower and drops from the heating temperature to room temperature.

Figure 6E:
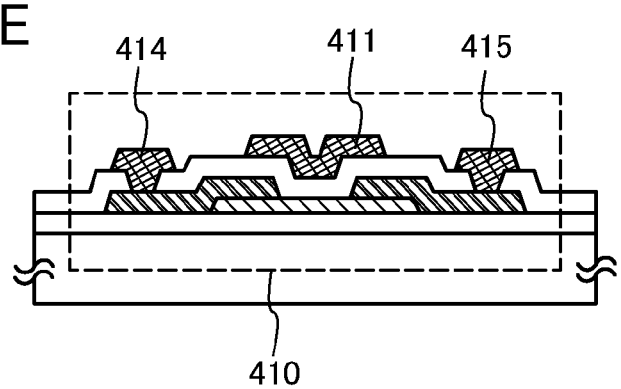

Through the above process, the transistor 410 including the high-purity oxide semiconductor film 412 in which the concentration of hydrogen, moisture, hydride, and hydroxide is reduced can be formed (see FIG. 6E).

In addition, a protective insulating film or a planarization insulating film for planarization may be formed over the transistor 410. The protective film can be formed to have a single-layer structure or a stacked-layer structure having a silicon oxide film, a silicon nitride film, a silicon oxynitride film, a silicon nitride oxide film, and/or an aluminum oxide film. The planarization insulating film can be formed using a heat-resistant organic material such as polyimide, acrylic, benzocyclobutene, polyamide, or epoxy. As an alternative to such organic materials, it is also possible to use a low-dielectric constant material (a low-k material), a siloxane-based resin, phosphosilicate glass (PSG), borophosphosilicate glass (BPSG), or the like. The planarization insulating film may be formed by stacking a plurality of insulating films formed using any of these materials.

Here, the siloxane-based resin corresponds to a resin including a Si—O—Si bond which is formed using a siloxane-based material as a starting material. The siloxane-based resin may include an organic group (e.g., an alkyl group or an aryl group) or a fluoro group as a substituent. In addition, the organic group may include a fluoro group.

The planarization insulating film can be formed, depending on the material, by a method such as sputtering, SOG, spin coating, dipping, spray coating, or a droplet discharging method (e.g., an ink-jet method, screen printing, or offset printing), or a tool such as a doctor knife, a roll coater, a curtain coater, or a knife coater.

As described above, by removing moisture remaining in the reaction atmosphere in the formation of the oxide semiconductor film, the concentration of hydrogen and hydride in the oxide semiconductor film can be reduced.

As described above, the oxide semiconductor film 412 which is the channel formation region, the electrode 416, the electrode 417, the gate electrode 411, the wiring layer 414, and the wiring layer 415, which are included in the transistor 410, are transmissive. Therefore, the transistor 410 is transmissive and light is not prevented from reaching the photoelectric conversion element 103.

Further, the transistor 410 includes the oxide semiconductor film 412 as the channel formation region, so that the channel formation region does not absorb light. A transistor including silicon in the channel formation region may function incorrectly because silicon included in the channel formation region absorbs light. On the other hand, the transistor 410 including the oxide semiconductor film 412 as the channel formation region functions correctly because the oxide semiconductor film 412 which is the channel formation region does not absorb light.

Figure 7A:
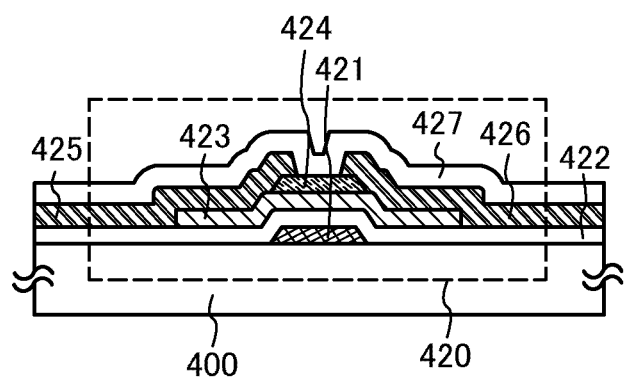
FIGS. 7A to 7C are cross-sectional views of transistors.
Figure 7B:
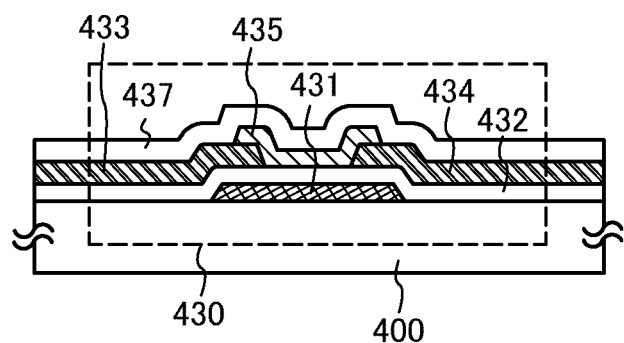
Figure 7C:
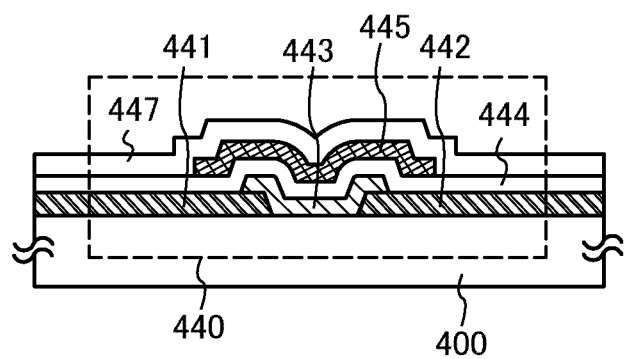

Then, FIGS. 7A to 7C each illustrate a structure example of a transistor including a high-purity oxide semiconductor, which is different from that of the transistor in FIGS. 5A and 5B.

A transistor 420 illustrated in FIG. 7A is a bottom-gate transistor. The transistor 420 includes a gate electrode 421 provided over the substrate 400, a gate insulating film 422 provided over the gate electrode 421, an oxide semiconductor film 423 which is provided over the gate insulating film 422 and which is overlapped with the gate electrode 421, a channel protective film 424 which is provided over the oxide semiconductor film 423 and which is overlapped with the gate electrode 421, and a conductive film 425 and a conductive film 426 which are provided over the oxide semiconductor film 423. The transistor 420 may include the insulating film 427 formed over the oxide semiconductor film 423, as its component. The transistor 420 can be referred to as a top-contact transistor because the conductive film 425 and the conductive film 426 which are a source electrode and a drain electrode are in contact with the top surface of the oxide semiconductor film 423 which is the channel formation region.

The channel protective film 424 can prevent a portion of the oxide semiconductor film 423, which is to be a channel formation region, from being damaged in a later step (for example, reduction in thickness due to plasma or an etchant in etching). Therefore, reliability of the transistor can be improved.

The channel protective film 424 can be formed using an inorganic material including oxygen (e.g., silicon oxide, silicon nitride oxide, silicon oxynitride, aluminum oxide, or aluminum oxynitride). The channel protective film 424 can be formed by vapor formation such as plasma CVD or thermal CVD, or sputtering. After the formation of the channel protective film 424, the film is processed by etching. Here, the channel protective film 424 is formed in such a manner that a silicon oxide film is formed by sputtering and processed by etching using a mask formed by photolithography.

In addition, when the channel protective film 424 is formed in contact with the oxide semiconductor film 423, a region in the oxide semiconductor film 423 which is in contact with the channel protective film 424 is increased in resistance and thereby becomes a high-resistance oxide semiconductor region. By forming the channel protective film 424, the oxide semiconductor film 423 can have the high-resistance oxide semiconductor region in the vicinity of the interface with the channel protective film 424.

Note that the transistor 420 may further include a back gate electrode over the insulating film 427. The back gate electrode is formed to overlap with a channel formation region in the oxide semiconductor film 423. Further, the back gate electrode may be electrically insulated and in a floating state, or may be supplied with a potential. In the latter case, the back gate electrode may be supplied with a potential at the same level as the gate electrode 421, or may be supplied with a fixed potential such as a ground potential. By controlling the level of the potential supplied to the back gate electrode, it is possible to control the threshold voltage of the transistor 420.

A transistor 430 in FIG. 7B is a bottom-gate transistor. The transistor 430 includes a gate electrode 431 provided over the substrate 400, a gate insulating film 432 provided over the gate electrode 431, a conductive film 433 and a conductive film 434 provided over the gate insulating film 432, and an oxide semiconductor film 435 overlapped with the gate electrode 431. The transistor 430 may include an insulating film 437 formed over the oxide semiconductor film 435, as its component. In the transistor 430, the conductive film 433 and the conductive film 434 which are the source electrode and the drain electrode are in contact with a bottom surface of the oxide semiconductor film 435 which includes a channel formation region; therefore, the transistor can be referred to as a bottom-contact transistor.

In addition, in the case of the bottom-contact transistor 430, the thickness of the conductive film 433 and the conductive film 434 is preferably small in order to prevent a break of the oxide semiconductor film 435 formed later. Specifically, the thickness of the conductive film 433 and the conductive film 434 is 10 nm or more and 200 nm or less, preferably 50 nm or more and 75 nm or less.

Note that the transistor 430 may further include a back gate electrode over the insulating film 437. The back gate electrode is formed to overlap with a channel formation region in the oxide semiconductor film 435. Further, the back gate electrode may be electrically insulated and in a floating state, or may be supplied with a potential. In the latter case, the back gate electrode may be supplied with a potential at the same level as the gate electrode 431, or may be supplied with a fixed potential such as a ground potential. By controlling the level of the potential supplied to the back gate electrode, it is possible to control the threshold voltage of the transistor 430.

A transistor 440 illustrated in FIG. 7C is a top-gate transistor. The transistor 440 includes a conductive film 441 and a conductive film 442 provided over the substrate 400, an oxide semiconductor film 443 partly overlapped with the conductive film 441 and the conductive film 442, a gate insulating film 444 provided over the oxide semiconductor film 443, and a gate electrode 445 which is provided over the gate insulating film 444 and which is overlapped with the oxide semiconductor film 443. Further, the transistor 440 may include an insulating film 447 provided over the gate electrode 445, as its component. The transistor 440 can be referred to as a bottom-contact transistor because the conductive film 441 and the conductive film 442 which are a source electrode and a drain electrode are in contact with a bottom surface of the oxide semiconductor film 443 which includes a channel formation region.

In addition, in the case of the top-contact transistor 440, the thickness of the conductive film 441 and the conductive film 442 is preferably small in order to prevent a break of the oxide semiconductor film 443 formed later. Specifically, the thickness of the conductive film 441 and the conductive film 442 is 10 nm or more and 200 nm or less, preferably 50 nm or more and 75 nm or less.

Note that a structure of the transistor 302 in the converter circuit 301 or the transistor 312 in the converter circuit 311 is not limited to a structure of the transistor 410, the transistor 420, the transistor 430, or the transistor 440. A power MOS (MIS) FET is preferably used as the transistor 302 or the transistor 312, because the power MOS (MIS) FET has high withstand voltage.

As described above, when the converter circuit 112 is formed with the use of transmissive materials, light passes through a region in which the converter circuit 112 is formed. When light passes through the region in which the converter circuit 112 is formed, the light receiving area of the photoelectric conversion element 103 is increased. When the light receiving area of the photoelectric conversion element 103 is increased, output current is increased. When the output current is increased, the power generation efficiency of the photoelectric conversion device is increased.

Note that in this embodiment, light is transmitted from a region in which the converter circuit 112 is provided to the photoelectric conversion element 103; however, light may be delivered from the photoelectric conversion element 103 if necessary. When light is delivered from the photoelectric conversion element 103, light electromotive force is increased, so that the power generation efficiency of the photoelectric conversion device is improved.

A transistor included in the converter circuit 112 is formed using an inexpensive oxide semiconductor film instead of an expensive single crystal silicon substrate, and cost of the converter circuit can be suppressed.

In this embodiment, a power conversion element is formed with the use of a thin film circuit including an oxide semiconductor film over a transmissive substrate, so that a photoelectric conversion device can be thinner.

In addition, a power conversion element is formed with the use of a thin film circuit including an oxide semiconductor film in accordance with this embodiment, so that cost for manufacturing a photoelectric conversion device including the power conversion element and the power conversion element can be suppressed.

Further, according to this embodiment, a power device such as a converter circuit is formed using an oxide semiconductor film with wide band gap, so that temperature characteristics become stable. Therefore, the temperature characteristics of a photoelectric conversion device including the converter circuit can be stable.

[Embodiment 2]

In this embodiment, an example of a circuit structure of the converter circuit described in Embodiment 1 will be described with reference to FIG. 8.

Figure 8:
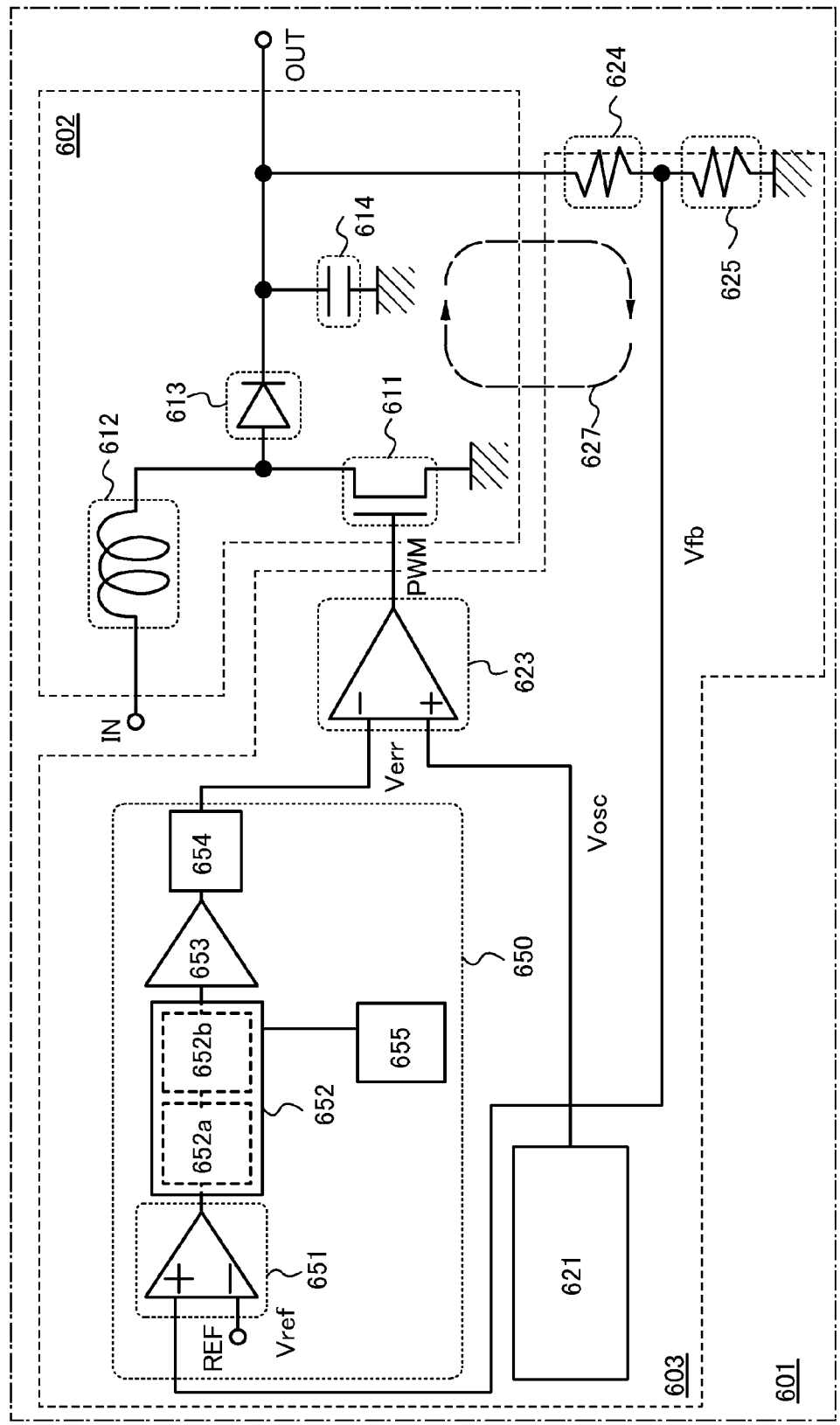
FIG. 8 is a circuit diagram of a power source circuit.

FIG. 8 illustrates a structure example of a power source circuit 601. The power source circuit 601 includes a voltage conversion circuit 602 which is a converter circuit, and a control circuit 603 of the voltage conversion circuit 602. The voltage conversion circuit 602 is the DC-DC converter in Embodiment 1.

The voltage conversion circuit 602 includes a transistor 611, a coil 612, a diode 613, and a capacitor 614. The control circuit 603 includes a triangle wave generator circuit 621, a digital control circuit 650, a pulse width modulation output driver 623, a resistor 624, and a resistor 625. In addition, a dotted arrow 627 indicates a loop of a feedback circuit. A feedback voltage Vfb, which is an output voltage of the resistor 624, is input to the digital control circuit 650.

The transistor 410, the transistor 420, the transistor 430, or the transistor 440 is preferably used as the transistor 611 of the voltage conversion circuit 602 because the transistor 611 becomes transmissive. Further, it is preferable to use transmissive materials as materials of the coil 612, the diode 613, and the capacitor 614. All of the elements in the voltage conversion circuit 602 become transmissive when transmissive materials are used as materials of the coil 612, the diode 613, and the capacitor 614. When all of the elements in the voltage conversion circuit 602 are transmissive, light to reach the photoelectric conversion element described in Embodiment 1 is not blocked, which is preferable.

Because the output voltage is high, the transistor 611 of the voltage conversion circuit 602 is preferably a transistor with high withstand voltage. As a transistor with high withstand voltage, a transistor including an oxide semiconductor film as a channel formation region is preferable.

The digital control circuit 650 includes a comparator 651, a digital arithmetic process circuit 652, a pulse width modulation output driver 653, and a low pass filter (LPF) 654.

In the digital control circuit 650, the digital arithmetic process circuit 652 and the pulse width modulation output driver 653 are digital circuits. The digital circuit determines whether a signal is 1 or 0 (zero) according to whether the level of the signal in the circuit is higher or lower than a reference, and therefore performs data processing properly even when elements in the digital circuit vary in characteristics.

In addition, in the digital control circuit 650, the use of passive elements having a large area (e.g., a capacitor and a resistor) is reduced; therefore, the digital control circuit 650 is preferable in that the area of the circuit can be reduced.

The comparator 651 compares a reference voltage Vref which is input from an inverted input terminal REF and the feedback voltage Vfb which is input from a non-inverted input terminal, and outputs a digital signal of H (high level) or L (low level), that is, a digital signal 1 or 0 (zero).

The digital arithmetic process circuit 652 includes a digital average-integrator 652a and a digital pulse width modulator 652b. To the digital arithmetic process circuit 652, the external clock divider 655 is connected, and a clock signal is input from the clock divider 655.

The digital arithmetic process circuit 652 performs an averaging process, an integration process, and a digital pulse width modulation process of the digital signal output from the comparator 651. In the digital arithmetic process circuit 652, the digital average-integrator 652a performs the averaging process and the integration process, and the digital pulse width modulator 652b performs the digital pulse width modulation process.

The digital arithmetic process circuit 652 holds N bits of data on the digital signal (which is either H (high level) or L (low level)) output from the comparator 651, compares the frequency of appearance of an H signal and an L signal, and outputs either one with a higher frequency. Thus, the digital signal is averaged.

Depending on the averaged digital signal, "−1" or "+1" is added and integration is performed. Note that when the averaged digital signal is an H signal, "−1" is added, while when the averaged digital signal is an L signal, "+1" is added. Thus, the averaged digital signal is integrated.

The phase position of the pulse width modulation is set in accordance with an integrated digital signal. Thus, a digital pulse width modulation process is performed. A pulse width modulation output signal which has been subjected to digital pulse width modulation is input to the pulse width modulation output driver 653.

The triangle wave generator circuit 621 generates a triangle wave Vosc which is needed for a pulse width modulation generation signal.

To an inverted input terminal of the pulse width modulation output driver 623, an output signal Verr of the digital control circuit 650 is input. To a non-inverted input terminal of the pulse width modulation output driver 623, the triangle wave Vosc generated by the triangle wave generator circuit 621 is input.

The pulse width modulation output driver 623 compares the output signal Verr of the digital control circuit 650 with the triangle wave Vosc. When the signal level of the triangle wave Vosc is higher than that of the output signal Verr of the digital control circuit 650, the pulse width modulation output driver 623 outputs H (high level) as the pulse width modulation signal to the transistor 611. When the signal level of the triangle wave Vosc is lower than that of the output signal Verr of the digital control circuit 650, the pulse width modulation output driver 623 outputs L (low level) as the pulse width modulation signal to the transistor 611.

As described above, when the voltage conversion circuit 602 is formed with the use of transmissive materials, light passes through a region in which the voltage conversion circuit 602 is provided. When light passes through the region in which the voltage conversion circuit 602 is provided, the light receiving area of the photoelectric conversion element described in Embodiment 1 is increased. When the light receiving area of the photoelectric conversion element is increased, output current is increased.

When output current is increased, the power generation efficiency of the photoelectric conversion device is increased.

A transistor included in the voltage conversion circuit 602 is formed using a reasonable oxide semiconductor film instead of an expensive single crystal silicon substrate, whereby, cost for the voltage conversion circuit can be suppressed.

[Embodiment 3]

A solar photovoltaic module can be obtained by using the photoelectric conversion device obtained by any of Embodiment 1, 2, or the like. Described is an example in which the obtained solar photovoltaic module is mounted on a vehicle.

Figure 9A:
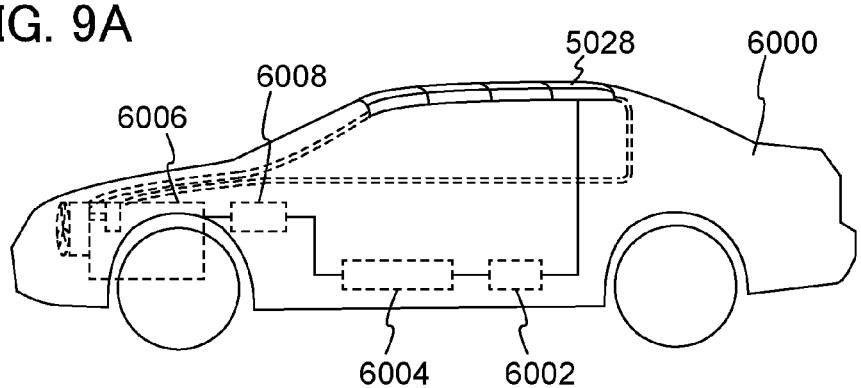
FIGS. 9A and 9B are views of an example of a car including a photoelectric conversion device and FIG. 9C is a cross-sectional view of a solar photovoltaic module.
Figure 9B:
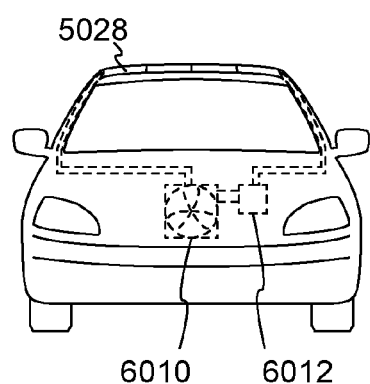
Figure 9C:
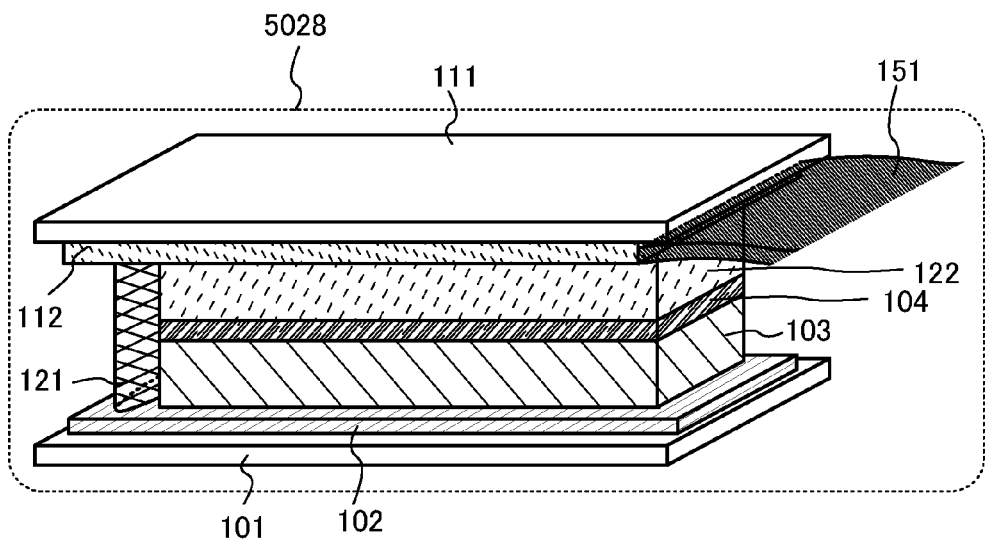

FIG. 9C illustrates an example of the solar photovoltaic module of this embodiment. The solar photovoltaic module of this embodiment is manufactured with the use of the photoelectric conversion device illustrated in Embodiment 1 or Embodiment 2.

A solar photovoltaic module 5028 in FIG. 9C includes, over the transmissive substrate 101, the transmissive conductive film 102; the photoelectric conversion element 103 provided in contact with the transmissive conductive film 102; and the transmissive conductive film 104 provided in contact with the photoelectric conversion element 103. Further, the solar photovoltaic module 5028 in FIG. 9C includes the converter circuit 112 formed using transmissive materials adjacent to the transmissive substrate 111. The converter circuit 112 is connected to a wiring 151 which electrically connects the solar photovoltaic module and an external device. 121 and 122 denote a wiring and an adhesive layer, respectively. Note that the same portion is denoted by the same reference numeral in the solar photovoltaic module 5028 illustrated in FIG. 9C and the photoelectric conversion device which is illustrated in FIG. 1A and described in Embodiment 1.

FIGS. 9A and 9B illustrate an example of an electric propulsion vehicle (car) 6000 in which the solar photovoltaic module 5028 illustrated in FIG. 9C is mounted on its roof portion. The solar photovoltaic module 5028 is connected to a battery or a capacitor 6004 through a converter 6002. In other words, the battery or the capacitor 6004 is charged with power supplied from the solar photovoltaic module 5028. Charge or discharge may be selected in accordance with operation condition of an engine 6006 which is monitored by a monitor 6008.

The photoelectric conversion efficiency of the solar photovoltaic module 5028 tends to be decreased by heat. In order to suppress such a decrease in photoelectric conversion efficiency, liquid for cooling or the like may be circulated in the solar photovoltaic module 5028. For example, cooling water in a radiator 6010 may be circulated by a circulation pump 6012. Needless to say, an embodiment of the disclosed invention is not limited to the structure in which the liquid for cooling is shared by the solar photovoltaic module 5028 and the radiator 6010. In the case where a decrease in photoelectric conversion efficiency is not serious, the liquid does not need to be circulated.

In this embodiment, a power conversion element is formed with the use of a thin film circuit including an oxide semiconductor film on a transmissive substrate, so that a photoelectric conversion device can be thinner.

In addition, a power conversion element is formed with the use of a thin film circuit including an oxide semiconductor film in accordance with this embodiment, so that cost for manufacturing a photoelectric conversion device including the power conversion element and the power conversion element can be suppressed.

Further, according to this embodiment, a power device such as a converter circuit is formed using an oxide semiconductor film with wide band gap, so that temperature characteristics become stable. Therefore, the temperature characteristics of a photoelectric conversion device including the converter circuit can be stable.

This embodiment is preferable because a photoelectric conversion device in which a photoelectric conversion element and a converter circuit are stacked, and a solar photovoltaic module including the photoelectric conversion device can be mounted on a limited region of a vehicle. When the solar photovoltaic module is mounted on the limited region of the vehicle, voltage generated by the photoelectric conversion element can be effectively used for other devices of the vehicle.

This application is based on Japanese Patent Application serial no. 2010-100337 filed with the Japan Patent Office on Apr. 23, 2010, the entire contents of which are hereby incorporated by reference.

What is claimed is:

1. A photoelectric conversion device comprising:
   a converter circuit including a transistor, the converter circuit being provided adjacent to a first substrate;
   a photoelectric conversion element including a photoelectric conversion layer provided so that external light is delivered from a first side of the photoelectric conversion element through a protective member and the transistor and a second side of the photoelectric conversion element through the protective member, the photoelectric conversion element being provided over a second substrate; and
   the protective member configured to encapsulate the photoelectric conversion element, the protective member comprising the first substrate, the second substrate, and a wiring electrically connecting the photoelectric conversion element and the converter circuit;
   wherein the converter circuit is configured to step up or down an output of the photoelectric conversion element,
   wherein the transistor overlaps the photoelectric conversion layer, and
   wherein the transistor has a channel formation region including an oxide semiconductor film.

2. The photoelectric conversion device according to claim 1, wherein the converter circuit is provided in a space surrounded by the protective member.

3. The photoelectric conversion device according to claim 1,
   wherein a part of the protective member provided adjacent to the photoelectric conversion element is transmissive, to which external light is delivered, and
   wherein the converter circuit is formed in contact with the part of the protective member.

4. The photoelectric conversion device according to claim 1, wherein the converter circuit includes a coil, a diode, and a capacitor.

5. The photoelectric conversion device according to claim 1, wherein the transistor is a top-gate transistor, and a top surface of the oxide semiconductor film is in contact with a source electrode and a drain electrode of the transistor.

6. The photoelectric conversion device according to claim 1, wherein the transistor is a top-gate transistor, and a bottom surface of the oxide semiconductor film is in contact with a source electrode and a drain electrode of the transistor.

7. The photoelectric conversion device according to claim 1, wherein the transistor is a bottom-gate transistor, and a top surface of the oxide semiconductor film is in contact with a source electrode and a drain electrode of the transistor.

8. The photoelectric conversion device according to claim 1, wherein the transistor is a bottom-gate transistor, and a bottom surface of the oxide semiconductor film is in contact with a source electrode and a drain electrode of the transistor.

9. A photoelectric conversion device comprising:
   a DC-DC converter including a transistor, the DC-DC converter being provided adjacent to a first substrate;
   a photoelectric conversion element including a photoelectric conversion layer provided so that external light is delivered from a first side of the photoelectric conversion element through a protective member and the transistor and a second side of the photoelectric conversion element through the protective member, the photoelectric conversion element being provided over a second substrate; and
   the protective member configured to encapsulate the photoelectric conversion element, the protective member comprising the first substrate, the second substrate, and a wiring electrically connecting the photoelectric conversion element and the DC-DC converter;
   wherein the DC-DC converter is configured to step up or down an output of the photoelectric conversion element,
   wherein the transistor overlaps the photoelectric conversion layer, and
   wherein the transistor has a channel formation region including an oxide semiconductor film.

10. The photoelectric conversion device according to claim 9, wherein the DC-DC converter is provided in a space surrounded by the protective member.

11. The photoelectric conversion device according to claim 9,
    wherein a part of the protective member which is provided adjacent to the photoelectric conversion element is transmissive, to which external light is delivered, and
    wherein the DC-DC converter is formed in contact with the part of the protective member.

12. The photoelectric conversion device according to claim 9, wherein the DC-DC converter includes a coil, a diode, and a capacitor.

13. The photoelectric conversion device according to claim 9, wherein the transistor is a top-gate transistor, and a top surface of the oxide semiconductor film is in contact with a source electrode and a drain electrode of the transistor.

14. The photoelectric conversion device according to claim 9, wherein the transistor is a top-gate transistor, and a bottom surface of the oxide semiconductor film is in contact with a source electrode and a drain electrode of the transistor.

15. The photoelectric conversion device according to claim 9, wherein the transistor is a bottom-gate transistor, and a top surface of the oxide semiconductor film is in contact with a source electrode and a drain electrode of the transistor.

16. The photoelectric conversion device according to claim 9, wherein the transistor is a bottom-gate transistor, and a bottom surface of the oxide semiconductor film is in contact with a source electrode and a drain electrode of the transistor.

17. A photoelectric conversion device comprising:
    a converter circuit including a transistor, the converter circuit being provided adjacent to a first substrate;

a solar cell including a photoelectric conversion layer provided so that external light is delivered from a first side of the solar cell through a protective member and the transistor and a second side of the solar cell through the protective member, the solar cell being provided over a second substrate; and the protective member configured to encapsulate the solar cell, the protective member comprising the first substrate, the second substrate, and a wiring electrically connecting the solar cell and the converter circuit;

wherein the converter circuit is configured to step up or down an output of the solar cell, wherein the transistor overlaps the photoelectric conversion layer, and wherein the transistor has a channel formation region including an oxide semiconductor film.

18. The photoelectric conversion device according to claim 17, wherein the converter circuit is provided in a space surrounded by the protective member.

19. The photoelectric conversion device according to claim 17, wherein a part of the protective member provided adjacent to the solar cell is transmissive, to which external light is delivered, and wherein the converter circuit is formed in contact with the part of the protective member.

20. The photoelectric conversion device according to claim 17, wherein the converter circuit includes a coil, a diode, and a capacitor.

21. The photoelectric conversion device according to claim 17, wherein the transistor is a top-gate transistor, and a top surface of the oxide semiconductor film is in contact with a source electrode and a drain electrode of the transistor.

22. The photoelectric conversion device according to claim 17, wherein the transistor is a top-gate transistor, and a bottom surface of the oxide semiconductor film is in contact with a source electrode and a drain electrode of the transistor.

23. The photoelectric conversion device according to claim 17, wherein the transistor is a bottom-gate transistor, and a top surface of the oxide semiconductor film is in contact with a source electrode and a drain electrode of the transistor.

24. The photoelectric conversion device according to claim 17, wherein the transistor is a bottom-gate transistor, and a bottom surface of the oxide semiconductor film is in contact with a source electrode and a drain electrode of the transistor.

25. A photoelectric conversion device comprising:

a DC-DC converter including a transistor, the DC-DC converter being provided adjacent to a first substrate;

a solar cell including a photoelectric conversion layer provided so that external light is delivered from a first side of the solar cell through a protective member and the transistor and a second side of the solar cell through the protective member, the solar cell being provided over a second substrate; and the protective member configured to encapsulate the solar cell, the protective member comprising the first substrate, the second substrate, and a wiring electrically connecting the solar cell and the DC-DC converter;

wherein the DC-DC converter is configured to step up or down an output of the solar cell, wherein the transistor overlaps the photoelectric conversion layer, and wherein the transistor has a channel formation region including an oxide semiconductor film.

26. The photoelectric conversion device according to claim 25, wherein the DC-DC converter is provided in a space surrounded by the protective member.

27. The photoelectric conversion device according to claim 25, wherein a part of the protective member which is provided adjacent to the solar cell is transmissive, to which external light is delivered, and wherein the DC-DC converter is formed in contact with the part of the protective member.

28. The photoelectric conversion device according to claim 25, wherein the DC-DC converter includes a coil, a diode, and a capacitor.

29. The photoelectric conversion device according to claim 25, wherein the transistor is a top-gate transistor, and a top surface of the oxide semiconductor film is in contact with a source electrode and a drain electrode of the transistor.

30. The photoelectric conversion device according to claim 25, wherein the transistor is a top-gate transistor, and a bottom surface of the oxide semiconductor film is in contact with a source electrode and a drain electrode of the transistor.

31. The photoelectric conversion device according to claim 25, wherein the transistor is a bottom-gate transistor, and a top surface of the oxide semiconductor film is in contact with a source electrode and a drain electrode of the transistor.

32. The photoelectric conversion device according to claim 25, wherein the transistor is a bottom-gate transistor, and a bottom surface of the oxide semiconductor film is in contact with a source electrode and a drain electrode of the transistor.

33. The photoelectric conversion device according to claim 1, wherein the photoelectric conversion layer includes an n-type semiconductor layer, an intrinsic semiconductor layer, and a p-type semiconductor layer stacked in this order.

34. The photoelectric conversion device according to claim 9, wherein the photoelectric conversion layer includes an n-type semiconductor layer, an intrinsic semiconductor layer, and a p-type semiconductor layer stacked in this order.

35. The photoelectric conversion device according to claim 17, wherein the photoelectric conversion layer includes an n-type semiconductor layer, an intrinsic semiconductor layer, and a p-type semiconductor layer stacked in this order.

36. The photoelectric conversion device according to claim 25, wherein the photoelectric conversion layer includes an n-type semiconductor layer, an intrinsic semiconductor layer, and a p-type semiconductor layer stacked in this order.

37. A photoelectric conversion device comprising:

a converter circuit including a transistor, the converter circuit being provided adjacent to a first substrate;

a photoelectric conversion element including a photoelectric conversion layer provided so that external light is delivered from at least one side of the photoelectric conversion element through the transistor, the photoelectric conversion element being provided over a second substrate; and a protective member configured to encapsulate the photoelectric conversion element, the protective member comprising the first substrate, the second substrate, and a wiring electrically connecting the photo electric conversion element and the converter circuit;

wherein the converter circuit is configured to step up or down an output of the photoelectric conversion element, wherein the transistor overlaps the photoelectric conversion layer, and wherein the transistor has a channel formation region including an oxide semiconductor film.

38. The photoelectric conversion device according to claim 37, wherein the converter circuit is provided in a space surrounded by the protective member.

39. The photoelectric conversion device according to claim 37, wherein a part of the protective member provided adjacent to the photoelectric conversion element is transmissive, to which external light is delivered, and wherein the converter circuit is formed in contact with the part of the protective member.

40. The photoelectric conversion device according to claim 37, wherein the converter circuit includes a coil, a diode, and a capacitor.

41. The photoelectric conversion device according to claim 37, wherein the transistor is a bottom-gate transistor, and a top surface of the oxide semiconductor film is in contact with a source electrode and a drain electrode of the transistor.

42. The photoelectric conversion device according to claim 37, wherein the photoelectric conversion layer includes an n-type semiconductor layer, an intrinsic semiconductor layer, and a p-type semiconductor layer stacked in this order.

* * * * *